(12) United States Patent
Park et al.

(10) Patent No.: US 12,113,050 B2
(45) Date of Patent: Oct. 8, 2024

(54) SEMICONDUCTOR PACKAGE WITH INCREASED THERMAL RADIATION EFFICIENCY

(71) Applicant: SAMSUNG ELECTRONICS CO., LTD., Suwon-si (KR)

(72) Inventors: Sang-Sick Park, Hwaseong-si (KR); Un-Byoung Kang, Hwaseong-si (KR); Jongho Lee, Hwaseong-si (KR); Teak Hoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 260 days.

(21) Appl. No.: 17/552,614

(22) Filed: Dec. 16, 2021

(65) Prior Publication Data

US 2022/0293566 A1 Sep. 15, 2022

(30) Foreign Application Priority Data

Mar. 11, 2021 (KR) .................. 10-2021-0032273

(51) Int. Cl.
*H01L 25/065* (2023.01)
*H01L 23/00* (2006.01)

(52) U.S. Cl.
CPC .......... *H01L 25/0657* (2013.01); *H01L 24/05* (2013.01); *H01L 24/06* (2013.01);
(Continued)

(58) Field of Classification Search
CPC ..... H01L 25/0657; H01L 24/05; H01L 24/06; H01L 24/16; H01L 24/32; H01L 2224/06051; H01L 2224/061; H01L 2224/16147; H01L 2224/73204; H01L 2225/06513; H01L 2225/06541; H01L 2224/14177; H01L 2224/13013;
(Continued)

(56) References Cited

U.S. PATENT DOCUMENTS 8,283,781 B2 10/2012 Wu et al.
9,559,071 B2 1/2017 Lu et al.
(Continued)

FOREIGN PATENT DOCUMENTS

JP 3416040 6/2003
JP 2009-218233 9/2009
(Continued)

*Primary Examiner* — Nduka E Ojeh
*Assistant Examiner* — Laura M Dykes
(74) *Attorney, Agent, or Firm* — F. CHAU & ASSOCIATES, LLC

(57) ABSTRACT

Disclosed is a semiconductor package with increased thermal radiation efficiency, which includes: a first die having signal and dummy regions and including first vias in the signal region, a second die on the first die and including second vias in the signal region, first die pads on a top surface of the first die and coupled to the first vias, first connection terminals on the first die pads which couple the second vias to the first vias, second die pads in the dummy region and on the top surface of the first die, and second connection terminals on the second die pads and electrically insulated from the first vias and the second vias. Each of the second die pads has a rectangular planar shape whose major axis is provided along a direction that leads away from the signal region.

17 Claims, 14 Drawing Sheets

(52) U.S. Cl.
CPC .............. *H01L 24/16* (2013.01); *H01L 24/32* (2013.01); *H01L 24/73* (2013.01); *H01L 2224/0401* (2013.01); *H01L 2224/05553* (2013.01); *H01L 2224/05555* (2013.01); *H01L 2224/06051* (2013.01); *H01L 2224/061* (2013.01); *H01L 2224/06519* (2013.01); *H01L 2224/16147* (2013.01); *H01L 2224/32145* (2013.01); *H01L 2224/73204* (2013.01); *H01L 2225/06513* (2013.01); *H01L 2225/06541* (2013.01); *H01L 2924/3841* (2013.01)

(58) Field of Classification Search
CPC . H01L 2224/05554; H01L 2224/14051; H01L 2224/1412; H01L 2224/14179; H01L 2224/0905; H01L 2224/09177; H01L 2224/09179
USPC .......................................................... 257/774
See application file for complete search history.

(56) References Cited

U.S. PATENT DOCUMENTS

| | | | |
|---|---|---|---|
| 9,564,412 | B2 | 2/2017 | Aleksov et al. |
| 9,589,921 | B2 | 3/2017 | Katagiri et al. |
| 10,546,844 | B2 | 1/2020 | Kim et al. |
| 10,784,219 | B2 | 9/2020 | Hu et al. |
| 2012/0098120 | A1 | 4/2012 | Yu et al. |
| 2016/0013144 | A1* | 1/2016 | Chen ................. H01L 23/49838 257/774 |
| 2016/0079208 | A1* | 3/2016 | Heo .................... H01L 25/0657 257/737 |
| 2019/0363068 | A1 | 11/2019 | Hotta |
| 2020/0091075 | A1 | 3/2020 | Yu et al. |
| 2021/0305184 | A1* | 9/2021 | Zhang .................... H01L 24/16 |

FOREIGN PATENT DOCUMENTS

| | | | |
|---|---|---|---|
| JP | 2009218233 A | * 9/2009 | ............. H01L 24/14 |
| JP | 6467981 | 2/2019 | |

* cited by examiner

SEMICONDUCTOR PACKAGE WITH INCREASED THERMAL RADIATION EFFICIENCY

CROSS-REFERENCE TO RELATED APPLICATION

This U.S. nonprovisional application claims priority under 35 U.S.C § 119 to Korean Patent Application No. 10-2021-0032273, filed on Mar. 11, 2021 in the Korean Intellectual Property Office, the disclosure of which is hereby incorporated by reference in its entirety.

TECHNICAL FIELD

The present inventive concepts relate to a semiconductor package, and more particularly, to a multi-chip semiconductor package with increased thermal radiation efficiency.

DISCUSSION OF RELATED ART

The electronic industry is constantly developing to improve electronic devices. Some desired characteristics of electronic devices often include light weight, compact size, high speed, and high performance.

A semiconductor package is used in many electronic devices and may include a processor and a memory. There has been research into enhancing the performance of the semiconductor package. In particular, through silicon via (TSV) technology has been suggested to meet high performance requirements needed in the semiconductor package where wire bonding technology is used.

A stacked multi-chip semiconductor package uses a circuit layer, a through electrode, a solder bump, and/or a gap fill in order to stack chips on each other and provide connectivity between the chips.

SUMMARY

In the fabrication of stacked multi-chip semiconductor packages, an increase in the number of stacked chips may increase the amount of circuit chips in the package and the gap fill between the chips, and may also induce degradation of the chips. For example, a semiconductor package with a relatively high number of stacked chips might not be able to radiate and/or dispose of heat efficiently, thereby causing degradation of the chips. In another example, an under-fill process for a semiconductor package with a relatively high number of stacked chips may create blockages through inefficient flow, thereby causing process defects in the semiconductor package.

Some embodiments of the present inventive concepts provide a semiconductor package with increased structural stability.

Some embodiments of inventive concepts provide a semiconductor package with increased thermal radiation efficiency.

Some example embodiments of the present inventive concepts provide a method of fabricating a semiconductor package, and the method may reduce the occurrence of defects.

Objects of the present inventive concepts is not limited to the mentioned above, and other objects which have not been mentioned above will be clearly understood to those skilled in the art from the following description.

According to some embodiments of the present inventive concepts, a semiconductor package may include: a first die having a signal region and a dummy region that surrounds the signal region, where the first die includes a plurality of first vias disposed in the signal region; a second die stacked on the first die, where the second die includes a plurality of second vias disposed in the signal region, and the second vias are positioned to correspond to the first vias; a plurality of first die pads disposed in the signal region on a top surface of the first die, where the first die pads are coupled to the first vias; a plurality of first connection terminals located between the first die and the second die and disposed on the first die pads, the first connection terminals coupling the second vias to the first vias; a plurality of second die pads disposed in the dummy region on the top surface of the first die; and a plurality of second connection terminals disposed between the first die and the second die on the second die pads, the second connection terminals being electrically insulated from both the first vias and the second vias. Each of the second die pads may have a rectangular planar shape whose major axis is provided along a direction that leads away from the signal region.

According to some embodiments of the present inventive concepts, a semiconductor package may include: a substrate; a plurality of dies vertically stacked on the substrate; an under-fill that fills a space between the dies; a molding layer disposed on the substrate and at least partially covering the dies; and a plurality of external terminals on a bottom surface of the substrate. Each of the dies may include: a plurality of vias that vertically penetrate the dies; a plurality of first pads disposed on a top surface of the dies and coupled to the vias; and a plurality of second pads and a plurality of third pads both disposed on the top surface of the dies and electrically separated from the vias, where each of the second and third pads has a rectangular planar shape. The second pads may be disposed adjacent to corners of the dies. A lateral surface of each of the second pads may be directed toward the corners of the dies. The third pads may be adjacent to lateral surfaces of the dies. A lateral surface of the third pads may be directed toward the lateral surfaces of the dies.

According to some embodiments of the present inventive concepts, a semiconductor package may include: a first die including a plurality of first vias disposed in a first central portion of the first die, a plurality of first pads coupled to the first vias, and a plurality of second pads electrically separated from the first vias; a second die stacked on the first die, the second die including a plurality of second vias disposed in a second central portion of the second die, a plurality of third pads coupled to the second vias, and a plurality of fourth pads electrically separated from the second vias, where the second vias are positioned to correspond to the first vias; a plurality of first connection terminals that connect the first pads to the third pads; and a plurality of second connection terminals that connect the second pads to the fourth pads. Each of the second and fourth pads may have a rectangular planar shape. The second pads may be arranged radially from the first central portion of the first die. The fourth pads may be arranged radially from the second central portion of the second die.

DETAILED DESCRIPTION OF EMBODIMENTS

Figure 1:
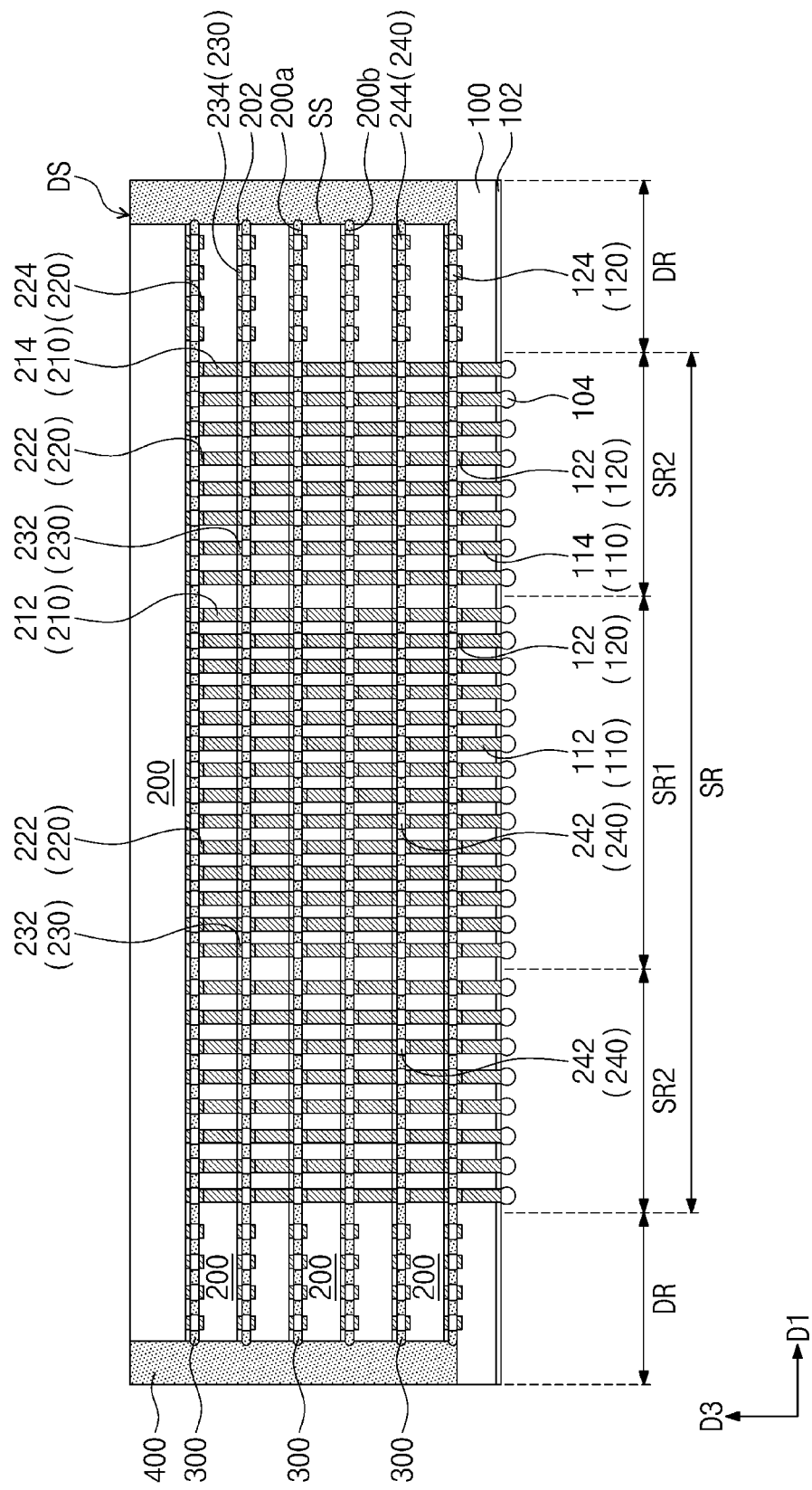
FIG. 1 is a cross-sectional view that shows a semiconductor package according to some embodiments of the present inventive concepts.

Hereinafter, example embodiments will be described in detail with reference to the accompanying drawings. Like reference numerals may refer to like components, and to the extent that a description of an element has been omitted, it may be understood that the element is at least similar to corresponding elements that are described elsewhere in the specification.

Figure 2:
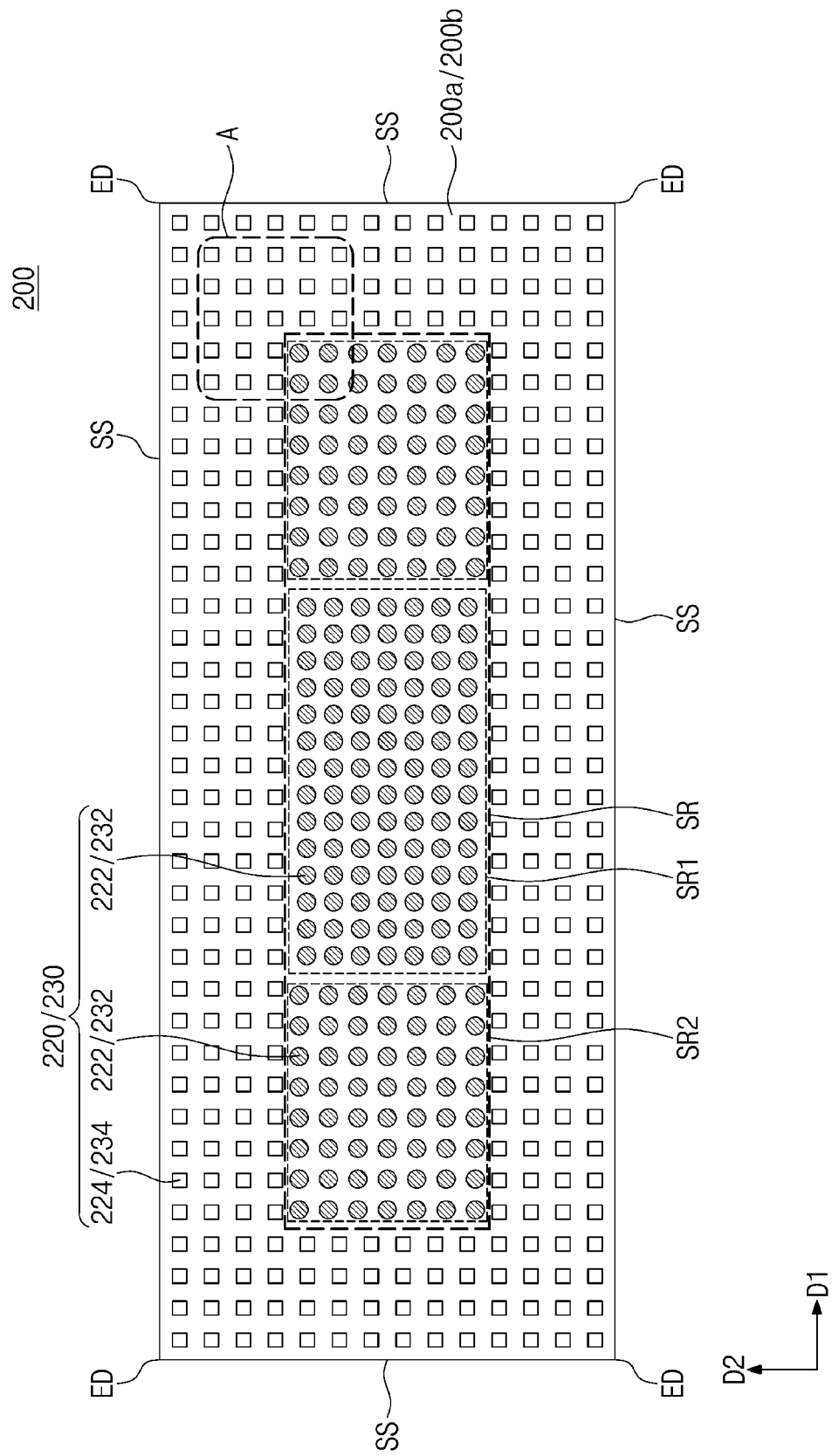
FIGS. 2 and 3 are plan views that show a semiconductor package according to some embodiments of the present inventive concepts.
Figure 3:
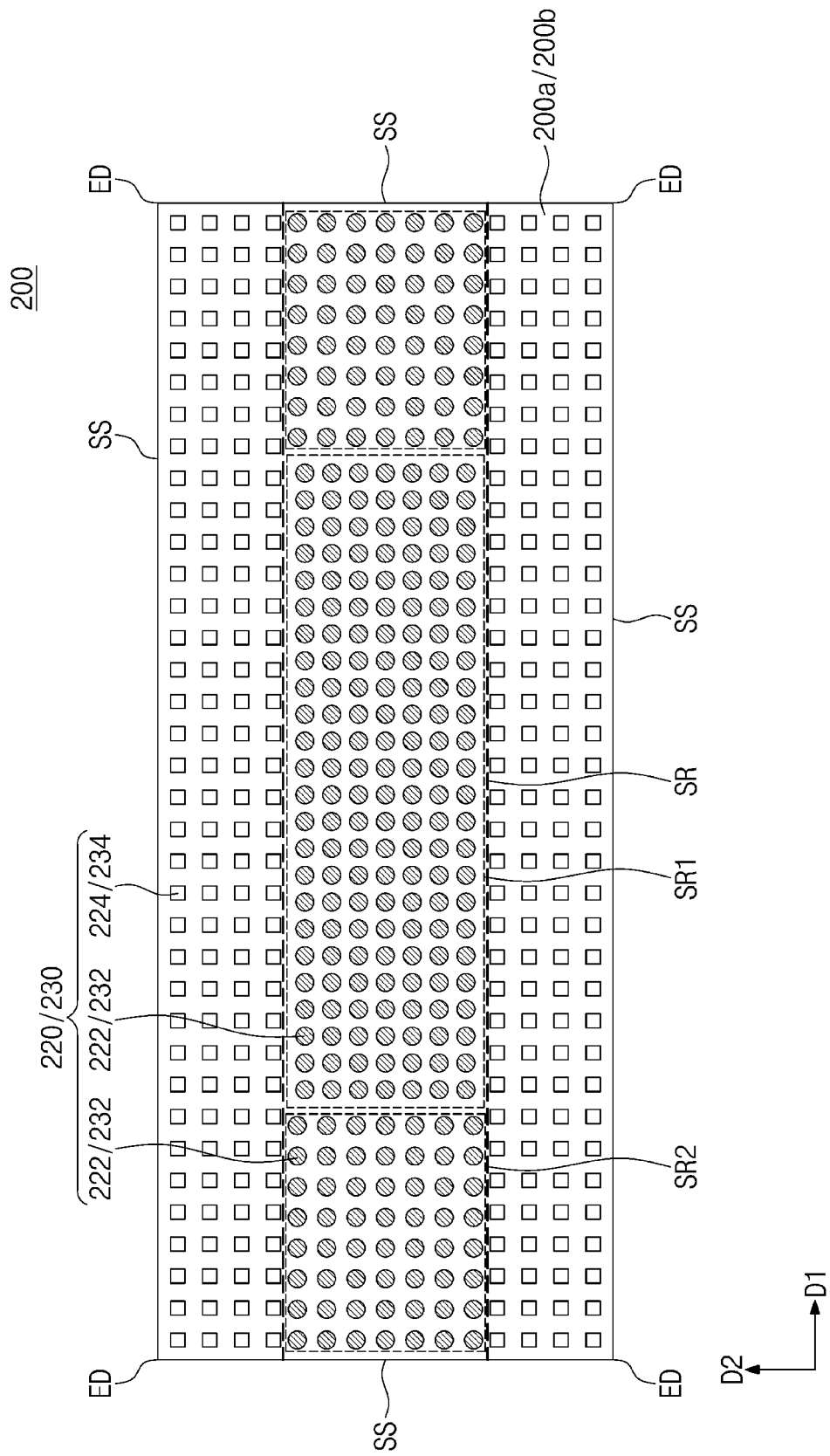
Figure 4:
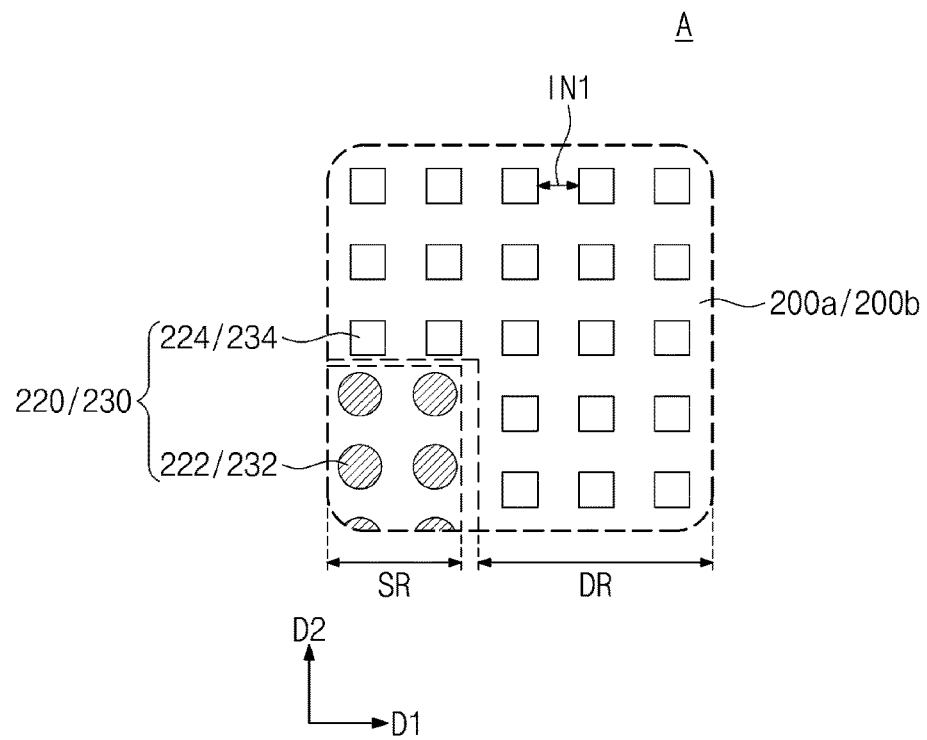
FIG. 4 is an enlarged view that shows section A of FIG. 2.
Figure 5:
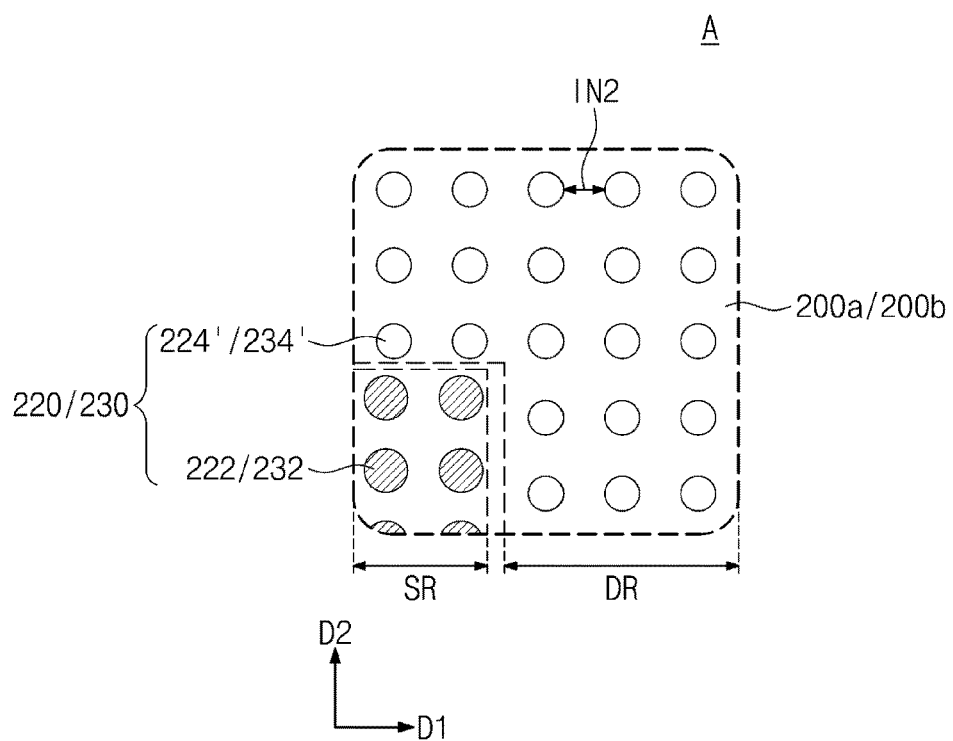
FIG. 5 is a plan view that shows an example where pads on a dummy region have circular shapes.

FIG. 1 is a cross-sectional view that shows a semiconductor package according to some embodiments of the present inventive concepts. FIGS. 2 and 3 are plan views of a top surface of a second die, that show a semiconductor package according to some embodiments of the present inventive concepts. FIGS. 2 and 3 depict arrangement and shapes of second upper pads, and the arrangement and shapes of second lower pads may correspond to those of second upper pads, and thus FIGS. 2 and 3 show reference numerals of second upper pads together with reference numerals of second lower pads. FIG. 4 is an enlarged view that shows section A of FIG. 2. FIG. 5 is a plan view that shows an example where pads on a dummy region have circular shapes.

In the following description, a first direction D1 and a second direction D2 are defined to be parallel to a top surface of a base substrate 100 while being orthogonal to each other, and a third direction D3 is defined to be perpendicular to the top surface of the base substrate 100.

Referring to FIGS. 1 to 4, a semiconductor package according to some embodiments of the present inventive concepts may be a stack package that uses vias. For example, second dies 200 of the same type may be stacked on the base substrate 100, and the second dies 200 may be electrically connected to each other through second vias 210 that penetrate the second dies 200. The second dies 200 may be coupled to each other through bumps 240 that are provided on bottom surfaces of the second dies 200. For example, the second dies 200 may include a micro-ball grid array (MBGA) or a micro-pillar grid array (MPGA).

A base substrate 100 may be provided. The base substrate 100 may include an integrated circuit therein. For example, the base substrate 100 may be a first die which includes an electronic device such as a transistor. The base substrate 100 may be, for example, a wafer-level semiconductor die formed of a semiconductor such as silicon (Si). FIG. 1 shows an example where the base substrate 100 is a first die, but the present inventive concepts are not necessarily limited thereto. According to some embodiments of the present inventive concepts, the base substrate 100 might not include an electronic device such as a transistor. The following will discuss an example in which the base substrate 100 and the first die are the same component.

When viewed in a plan view, the first die 100 may include a signal region SR that rests on a central portion of the first die 100 and a dummy region DR that surrounds the signal region SR. The signal region SR may extend in the first direction D1. For example, a long side of the signal region SR may extend in the first direction D1. The signal region SR may have a first signal region SR1 and a second signal region SR2 that are divided from each other. For example, the signal region SR may include two second signal regions SR2 with a first signal region SR1 disposed therebetween. The first signal region SR1 may be an area where wiring lines for processing signals in the integrated circuit of the first die 100 are provided, and the second region SR2 may be an area where wiring lines for various signals (e.g., power signal and ground signal) for driving the integrated circuit of the first die 100 are provided. The second signal region SR2 may be disposed in the first direction D1 adjacent to the first signal region SR1. The present inventive concepts, however, are not necessarily limited thereto, and the first signal region SR1 and the second signal region SR2 may be provided in plural, or may be disposed and positioned in various ways. The dummy region DR might not include wiring lines electrically connected to the integrated circuit in the first die 100. The dummy region DR may surround the signal region SR. The present inventive concepts, however, are not necessarily limited thereto, and in some embodiments, the dummy region DR and the signal region SR may be disposed in various ways. For example, as shown in FIG. 3, the signal region SR may run across the first die 100 in the first direction D1, and the dummy regions DR may be disposed on opposite sides of the signal region SR in the second direction D2. In this case, the dummy regions DR may extend in the first direction D1. For example, the signal region SR may extend in the first direction D1 between (e.g., inside) the dummy regions DR. The following description will focus on the embodiment illustrated in FIG. 2.

The first die 100 may include a first circuit layer 102 and first vias 110.

The first circuit layer 102 may be provided on a bottom surface of the first die 100. The first circuit layer 102 may include an integrated circuit. For example, the first circuit layer 102 may be a memory circuit, a logic circuit, or a combination thereof. The bottom surface of the first die 100 may be, for example, an active surface of the first die 100.

The first vias 110 may penetrate in the third direction D3 through the first die 100. The first vias 110 may be electrically connected to the first circuit layer 102. The first vias 110 may include first signal vias 112 provided on the first signal region SR1 and first power/ground vias 114 provided on the second signal region SR2.

The first signal vias 112 may be electrically connected to the integrated circuit of the first die 100. The first signal vias 112 may be arranged along the first direction D1 and the second direction D2 in the first signal region SR1. The first signal vias 112 may be provided in a grid shape. In some embodiments, the first signal vias 112 may be arranged in rows, and the rows may be shifted from each other in the first direction D1 or the second direction D2. For example, in some embodiments, the first signal vias 112 may be disposed in a zigzag pattern along the first direction D1 or the second direction D2. In some embodiments, the first signal vias 112 may be arranged in a honeycomb pattern.

The first power/ground vias 114 may be electrically connected to a power or ground circuit of the first die 100. The first power/ground vias 114 may be electrically insulated from the first signal vias 112. On the second signal region SR2, the first power/ground vias 114 may be arranged along the first direction D1 and the second direction D2. For example, the first power/ground vias 114 may be provided in a grid shape. In some embodiments, the first power/ground vias 114 may be arranged in rows, and the rows may be shifted from each other in the first direction D1 or the second direction D2. For example, in some embodiments, the first power/ground vias 114 may be disposed in a zigzag pattern along the first direction D1 or the second direction D2. In some embodiments, the first power/ground vias 114 may be arranged in a honeycomb pattern.

The first die 100 might not include separate via(s) on the dummy region DR. For example, there might not be vias disposed in the dummy region DR of the first die 100.

The first die 100 may include first upper pads 120 which are disposed on the top surface of the first die 100. The first upper pads 120 may include first upper signal pads 122 provided on the signal region SR and first upper dummy pads 124 provided on the dummy region DR.

The first upper signal pads 122 may be correspondingly coupled to the first vias 110. For example, there may be one first upper signal pad 122 coupled to a corresponding first via 110 for every first via 110. For example, the first upper signal pads 122 may be coupled to the first signal vias 112 on the first signal region SR1 and to the first power/ground vias 114 on the second signal region SR2. The first upper signal pads 122 may each have a circular shape when viewed in a plan view. An arrangement of the first upper signal pads 122 may conform to the arrangement of the first vias 110. For example, the first upper signal pads 122 may be arranged along the first direction D1 and the second direction D2.

The first upper dummy pads 124 may be provided on the dummy region DR and may be electrically insulated from the first vias 110. In addition, the first upper dummy pads 124 may be electrically insulated from the first circuit layer 102.

The first upper dummy pads 124 may be arranged in a direction leading away from the signal region SR. For example, the first upper dummy pads 124 may be arranged along one or more directions which begin from the signal region SR and lead toward lateral surfaces of the first die 100.

The first upper dummy pads 124 may each have a tetragonal shape when viewed in a plan view. For example, the first upper dummy pads 124 may each have a square or rectangular shape when viewed in a plan view. Each of the first upper dummy pads 124 may have a lateral surface directed toward the signal region SR. For example, the first upper dummy pads 124 may each have a major axis provided in a direction that is parallel to a line which extends from each first upper dummy pad 124 to the signal region SR. In this description, the term "major axis" may indicate an axis that extends along a long-width direction of a tetragonal shape, and may be parallel to a long side of the tetragonal shape. Based on a planar shape of the first dummy pad 124, the major axis of the first upper dummy pad 124 may mean a long-width direction of a planar rectangular shape of the first upper dummy pad 124. When the first upper dummy pads 124 have square shapes when viewed in a plan view, a major axis may refer to each of two directions parallel to the lateral surfaces of the first upper dummy pads 124. As the dummy region DR surrounds the signal region SR in this embodiment, some lateral (e.g., one or more) surfaces of the first upper dummy pads 124 may be directed toward the signal region SR, and other lateral surfaces of the first upper dummy pads 124 may be directed toward the lateral surfaces of the first die 100.

According to some embodiments of the present inventive concepts, the first upper dummy pads 124 may have tetragonal shapes when viewed in a plan view. In embodiments where the first upper dummy pads 124 are disposed at regular intervals and spacing, the first upper dummy pads 124 may larger areas when the first upper dummy pads 124 are tetragonal than when the first upper dummy pads 124 are circular. Accordingly, it may be possible to increase efficiency of thermal radiation through the first upper dummy pads 124.

The first die 100 may include external terminals 104. The external terminals 104 may be provided on the bottom surface of the first die 100. The external terminals 104 may be disposed below the first vias 110. In some embodiments, first lower pads may be provided on the bottom surface of the first die 100, and the external terminals 104 may be disposed on the first lower pads. The external terminals 104 may be electrically connected to the first circuit layer 102 and the first vias 110.

In some embodiments, the first die 100 may further include a passivation layer. The passivation layer may be disposed on the bottom surface of the first die 100, covering the first circuit layer 102. The passivation layer may protect the first circuit layer 102. The passivation layer may include silicon nitride (SiN). The passivation layer may expose the external terminals 104.

A die stack DS may be disposed on the first die 100. The die stack DS may include second dies 200 stacked on the first die 100. The following will provide description of a single second die 200 in describing configurations of the second dies 200.

The second die 200 may be provided. The second die 200 may include an electronic device such as a transistor. For example, the second die 200 may be a wafer-level semiconductor die formed of a semiconductor such as silicon (Si). The second die 200 may have a width less than that of the first die 100.

When viewed in a plan view, the second die 200 may include a signal region SR that rests on a central portion of the second die 200 and a dummy region DR that surrounds the signal region SR. The signal and dummy regions SR and DR of the second die 200 may correspond to the signal and dummy regions SR and DR of the first die 100. For example, the signal and dummy regions SR and DR of the second die 200 may have shapes substantially the same as those of the signal and dummy regions SR and DR of the first die 100, and may respectively vertically overlap the signal and dummy regions SR and DR of the first die 100. In this description below, sections of the second die 200 that are designated by the same terms used for corresponding sections of the first die 100 will indicate the same sections to which the corresponding sections of the first die 100 are projected.

The second die 200 may include a second circuit layer 202 and second vias 210. An uppermost second die 200 of the die stack DS might not include second vias 210.

The second circuit layer 202 may be provided on a bottom surface 200b of the second die 200. The second circuit layer 202 may include an integrated circuit. For example, the second circuit layer 202 may include a memory circuit, a logic circuit, or a combination thereof. For example, the bottom surface 200b of the second die 200 may be an active surface of the second die 200.

The second vias 210 may penetrate through the second die 200 in the third direction D3. The second vias 210 may be electrically connected to the second circuit layer 202. The second vias 210 may have substantially the same configuration and arrangement the first vias 110. The second vias 210 may include second signal vias 212 provided on the first signal region SR1 and second power/ground vias 214 provided on the second signal region SR2. For example, when viewed in a plan view, an arrangement of the second signal vias 212 and the second power/ground vias 214 may be substantially the same as that of the first signal vias 112 and the first power/ground vias 114.

The second signal vias 212 may be electrically connected to the integrated circuit of the second die 200. The second signal vias 212 may be arranged along the first direction D1 and the second direction D2 in the first signal region SR1. For example, the second signal vias 212 may be provided in a grid shape. In some embodiments, the second signal vias 212 may be arranged in rows, and the rows may be shifted from each other in the first direction D1 or the second direction D2. For example, the second signal vias 212 may be disposed in a zigzag pattern along the first direction D1 or the second direction D2. In some embodiments, the second signal vias 212 may be arranged in a honeycomb pattern.

The second power/ground vias 214 may be electrically connected to a power or ground circuit of the second die 200. The second power/ground vias 214 may be electrically insulated from the second signal vias 212. On the second signal region SR2, the second power/ground vias 214 may be arranged along the first direction D1 and the second direction D2. For example, the second power/ground vias 214 may be provided in a grid shape. In some embodiments, the second power/ground vias 214 may be arranged in rows, and the rows may be shifted from each other in the first direction D1 or the second direction D2. For example, the second power/ground vias 214 may be disposed in a zigzag pattern along the first direction D1 or the second direction D2. In some embodiments, the second power/ground vias 214 may be arranged in a honeycomb pattern.

The second die 200 might not include separate via(s) on the dummy region DR. For example, there might not be vias disposed in the dummy region DR of the second die 200.

The second die 200 may include second upper pads 220 disposed on a top surface 200a of the second die 200. The second upper pads 220 may include second upper signal pads 222 provided on the signal region SR and second upper dummy pads 224 provided on the dummy region DR. The uppermost second die 200 of the die stack DS might not include second upper pads 220.

The second upper signal pads 222 may be correspondingly coupled to the second vias 210. For example, the second upper signal pads 222 may be coupled to the second signal vias 212 on the first signal region SR1 and to the second power/ground vias 214 on the second signal region SR2. The second upper signal pads 222 may each have a circular shape when viewed in a plan view. An arrangement of the second upper signal pads 222 may conform to the arrangement of the second vias 210. For example, the second upper signal pads 222 may be arranged along the first direction D1 and the second direction D2, and may be arranged at the same interval and with the same spacing.

The second upper dummy pads 224 may be provided on the dummy region DR and may be electrically insulated from the second vias 210. In addition, the second upper dummy pads 224 may be electrically insulated from the second circuit layer 202.

The second upper dummy pads 224 may be arranged in a direction leading away from the signal region SR. For example, the second upper dummy pads 224 may be arranged along one or more directions which begin from the signal region SR and lead toward lateral surfaces SS of the second die 200. FIG. 1 shows that top surfaces of the second upper pads 220 are coplanar with the top surface 200a of the second die 200, but the present inventive concepts are not necessarily limited thereto. The second upper pads 220 may protrude off the top surface 200a of the second die 200. In this case, the spaces between the second upper dummy pads 224 may provide a flow path along which an under-fill 300 migrates during fabrication of a semiconductor package. As the second upper dummy pads 224 are arranged toward the lateral surfaces SS of the second die 200, the flow path may have a straight shape and the under-fill 300 may flow favorably. For example, as used herein, "favorable" flow of the under-fill 300 may refer to flow that prevents process defects, such as: flow at a consistent rate, flow that doesn't fill too excessively or insufficiently in areas, and/or flow that prevents obstruction. This will be further discussed below in detail in describing a method of fabricating a semiconductor package.

The second upper dummy pads 224 may each have a tetragonal shape when viewed in a plan view. For example, the second upper dummy pads 224 may each have a square or rectangular shape when viewed in a plan view. The second upper dummy pads 224 may have lateral surfaces directed toward the signal region SR. For example, the second upper dummy pads 224 may have major axes along a direction that leads away from the signal region SR. As the dummy region DR is disposed to surround the signal region SR, some lateral surfaces of the second upper dummy pads 224 may be directed toward the signal region SR, and other lateral surfaces of the second upper dummy pads 224 may be directed toward the lateral surfaces SS of the second die 200.

The second die 200 may include second lower pads 230 disposed on the bottom surface 200b of the second die 200. The second lower pads 230 may include second lower signal pads 232 provided on the signal region SR and second lower dummy pads 234 provided on the dummy region DR.

The second lower signal pads 232 may be coupled to the second circuit layer 202 or corresponding second vias 210. The second lower signal pads 232 may each have a circular shape when viewed in a plan view. An arrangement of the second lower signal pads 232 may conform to the arrangement of the second upper signal pads 222 of the second die 200 disposed below the second lower signal pads 232. For example, the second lower signal pads 232 may be arranged along the first direction D1 and the second direction D2.

The second lower dummy pads 234 may be provided in the dummy region DR and may be electrically insulated from the second vias 210. In addition, the second lower dummy pads 234 may be electrically insulated from the second circuit layer 202.

An arrangement of the second lower dummy pads 234 may conform to the arrangement of the second upper dummy pads 224 of the second die 200 disposed below the second lower dummy pads 234. The second lower dummy pads 234 may be arranged in a direction away from the signal region SR. For example, the second lower dummy pads 234 may be arranged along a direction from the signal region SR toward the lateral surfaces SS of the second die 200. FIG. 1 shows that bottom surfaces of the second lower pads 230 are coplanar with the bottom surface 200b of the second die 200, but the present inventive concepts are not necessarily limited thereto. The second lower pads 230 may be provided to protrude on the bottom surface 200b of the second die 200. In this case, spaces between the second lower dummy pads 234 may provide a flow path along which the under-fill 300 migrates during fabrication of a semiconductor package. As the second lower dummy pads 234 are arranged toward the lateral surfaces SS of the second die 200, the flow path may have a straight shape and the under-fill 300 may flow favorably. This will be further discussed below in detail in describing a method of fabricating a semiconductor package.

A planar shape of the second lower dummy pads 234 may conform to that of the second upper dummy pads 224 of the second die 200 disposed below the second lower dummy pads 234. The second lower dummy pads 234 may each have a tetragonal shape when viewed in a plan view. For example, the second lower dummy pads 234 may each have a square or rectangular shape when viewed in a plan view. The second lower dummy pads 234 may have lateral surfaces directed toward the signal region SR. For example, the second lower dummy pads 234 may have major axes provided along a direction that leads away from the signal region SR. As the dummy region DR is disposed to surround the signal region SR, some lateral surfaces of the second lower dummy pads 234 may be directed toward the signal region SR, and other lateral surfaces of the second lower dummy pads 234 may be directed toward the lateral surfaces SS of the second die 200.

Neighboring second dies 200 may be connected to each other through the bumps 240. For example, first bumps 242 may connect the second upper signal pads 222 and the second lower signal pads 232 that face each other in the signal region SR. Second bumps 244 may connect the second upper dummy pads 224 and the second lower dummy pads 234 that face each other in the dummy region DR. Accordingly, the second dies 200 may be electrically connected to each other through the second upper signal pads 222, the first bumps 242, and the second lower signal pads 232. The second dies 200 may transfer heat to each other through the second upper dummy pads 224, the second bumps 244, and the second lower dummy pads 234. The first bumps 242 may have planar shapes that conform to those of the second upper signal pads 222 and those of the second lower signal pads 232. For example, the first bumps 242 may have circular shapes when viewed in a plan view. The second bumps 244 may have planar shapes that conform to those of the second upper dummy pads 224 and those of the second lower dummy pads 234. For example, the second bumps 244 may each have a tetragonal shape when viewed in a plan view. The second bumps 244 may have lateral surfaces that are directed toward the signal region SR and other lateral surfaces that are directed toward the lateral surfaces SS of the second die 200. Spaces between the second bumps 244 may provide a flow path along which the under-fill 300 migrates during fabrication of a semiconductor package. As the second bumps 244 are arranged toward the lateral surfaces SS of the second die 200, the flow path may have a straight shape and the under-fill 300 may flow favorably. This will be further discussed below in detail in describing a method of fabricating a semiconductor package.

FIG. 5 is a plan view that shows an example where pads on a dummy region have circular shapes. As shown in FIG. 5, second upper dummy pads 224' and second lower dummy pads 234' have circular shapes when viewed in a plan view, and the dummy pads 224' and 234' may each have a second width, and may be arranged at a second interval IN2. In this case, the flow path for the under-fill 300 may have a width that depends on the size of the second interval IN2, and thermal radiation efficiency of the second die 200 may depend on areas of the dummy pads 224' and 234'. For example, the thermal radiation efficiency of the second die 200 may depend on the cross-sectional areas of the dummy pads 224' and 234', where the cross-section is taken along a horizontal plane that is parallel to the first and second directions D1 and D2.

According to some embodiments of the present inventive concepts, as shown in FIG. 4, the second upper dummy pads 224 and the second lower dummy pads 234 may each have a tetragonal shape when viewed in a plan view. The dummy pads 224 and 234 may each have a first width, and may be arranged at a first interval IN1. In this case, the flow path for the under-fill 300 may have a width that depends on the size of the first interval IN1, and thermal radiation efficiency of the second die 200 may depend on areas of the dummy pads 224 and 234. For example, the thermal radiation efficiency of the second die 200 may depend on the cross-sectional areas (along the above described horizontal plane) of the dummy pads 224 and 234. When the first interval IN1 and the second interval IN2 are the same, and when the first width and the second width are the same as each other, each of the tetragonal dummy pads 224 and 234 depicted in FIG. 4 may have a larger area than the area of each of the circular dummy pads 224' and 234' depicted in FIG. 5. Therefore, in embodiments according to the present inventive concepts such as the embodiment illustrated in FIG. 4, as the dummy pads 224 and 234 are provided with tetragonal shapes, the second die 200 may have increased thermal radiation efficiency while avoiding a reduction in width of the flow path for the under-fill 300.

Referring again to FIGS. 1 to 4, the die stack DS and the first die 100 may constitute a chip-on-wafer (COW) structure. For example, the bumps 240 may be attached to the bottom surface 200b of a lowermost second die 200, and the die stack DS may face down to allow the bottom surface 200b of the lowermost second die 200 to face the top surface of the first die 100. The bumps 240 provided on the second lower pads 230 may be used to mount the lowermost second die 200 on the first die 100. The bumps 240 may connect the first upper pads 120 of the first die 100 to the second lower pads 230 of the second die 200.

The under-fill 300 may be provided between the second dies 200 and/or between the die stack DS and the first die 100. The under-fill 300 may include a fluidic adhesive member or a non-conductive film (NCF). For example, the under-fill 300 may be a polymer tape including a dielectric material. The under-fill 300 may be interposed between the bumps 240, and thus electrical shorts may be prevented between the bumps 240. The under-fill 300 may partially protrude onto the lateral surfaces SS of the second dies 200. The present inventive concepts, however, are not necessarily limited thereto.

A molding layer 400 may be disposed on the first die 100. The molding layer 400 may cover the top surface of the first die 100. When viewed in a plan view, the molding layer 400 may surround the die stack DS. The molding layer 400 may include a dielectric polymer material. For example, the molding layer 400 may include an epoxy molding compound (EMC).

In the embodiments that follow, repetitive description of components from FIGS. 1 to 4 may be omitted for convenience of description, and a difference thereof will be discussed in detail. The same reference numerals may refer to the same components as those of the semiconductor package according to some embodiments of the present inventive concepts. In addition, although arrangement and shapes of second upper pads are selectively illustrated for convenience of description in figures of the embodiments that follow, the arrangement and shapes of second lower pads may correspond to those of the second upper pads, and a description of the second upper pads may be identically or similarly applicable to the second lower pads. In figures of the embodiments that follow, reference numerals for the second upper pads will be denoted along with those for the second lower pads.

Figure 6:
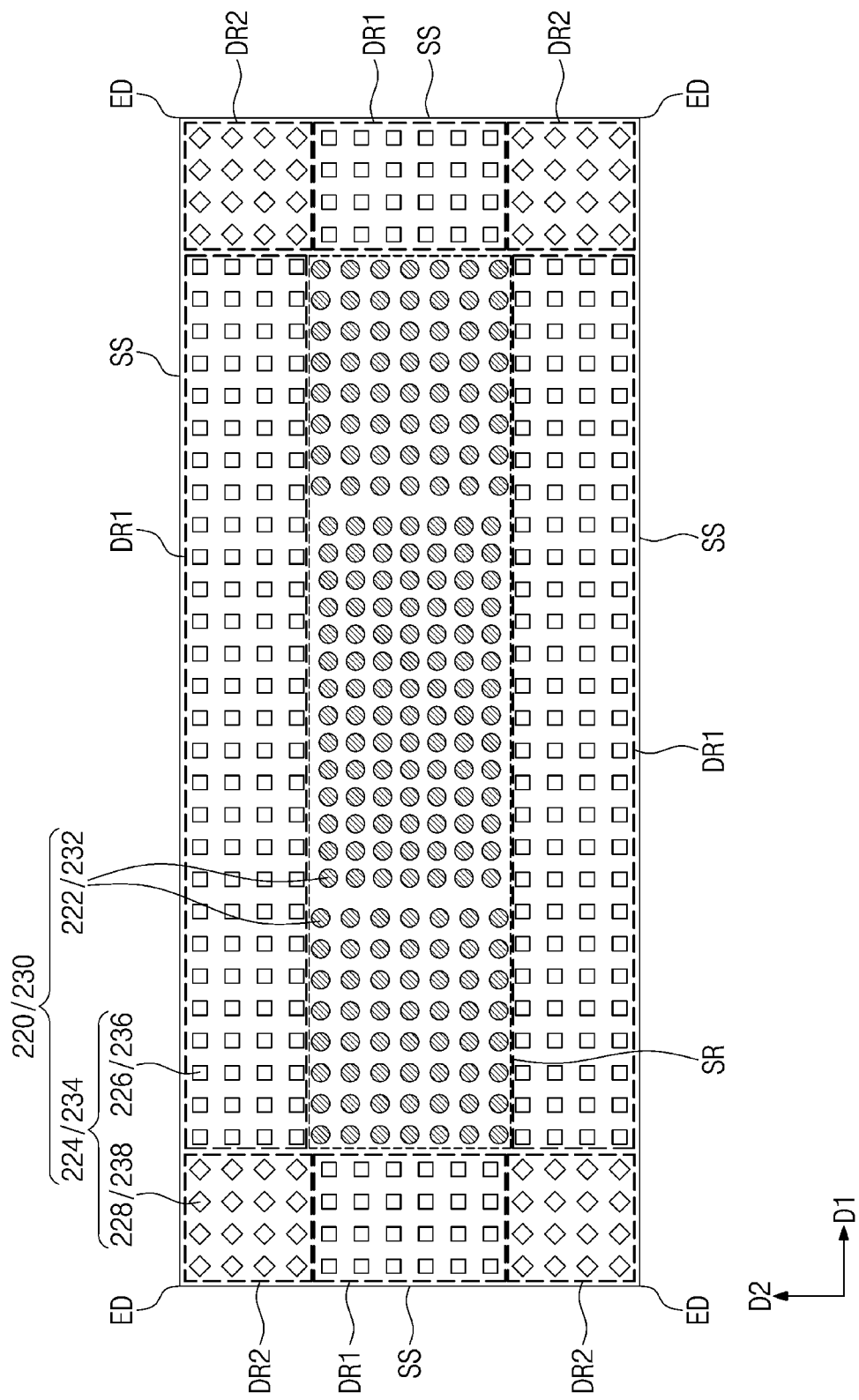
FIGS. 6 to 9 are plan views that show a semiconductor package according to some embodiments of the present inventive concepts.

FIG. 6 is a plan view that shows a semiconductor package according to some embodiments of the present inventive concepts.

Referring to FIGS. 1 and 6, the dummy region DR may include first dummy regions DR1 and second dummy regions DR2. In the dummy region DR, the first dummy regions DR1 may correspond to areas positioned between the signal region SR and the lateral surfaces SS of the second die 200, and the second dummy regions DR2 may correspond to areas positioned between the signal region SR and corners ED of the second die 200. For example, the first dummy regions DR1 may be adjacent to the lateral surfaces SS of the second die 200, and the second dummy regions DR2 may be adjacent to the corners ED of the second die 200.

The second upper dummy pads 224 may include third upper dummy pads 226 and fourth upper dummy pads 228.

The third upper dummy pads 226 may be provided in the first dummy regions DR1. The third upper dummy pads 226 may be arranged in a direction that leads away from the signal region SR. For example, the third upper dummy pads 226 may be arranged along a direction from the signal region SR toward the lateral surfaces SS of the second die 200. For example, the third upper dummy pads 226 may be arranged along the first direction D1 and the second direction D2.

The third upper dummy pads 226 may each have a tetragonal shape when viewed in a plan view. For example, the third upper dummy pads 226 may each have a square or rectangular shape when viewed in a plan view. The third upper dummy pads 226 may have major axes that are provided in a direction that leads away from the signal region SR and are directed toward the lateral surfaces SS of the second die 200. For example, as the dummy region DR is disposed to surround the signal region SR, some (e.g., one or more) lateral surfaces of the third upper dummy pads 226 may be directed toward the signal region SR, and other lateral surfaces of the third upper dummy pads 226 may be directed toward the lateral surfaces SS of the second die 200.

The fourth upper dummy pads 228 may be provided in the second dummy regions DR2. The fourth upper dummy pads 228 may be arranged identically to the third upper dummy pads 226; for example, in an identical pattern. For example, the fourth upper dummy pads 228 may be arranged along the first direction D1 and the second direction D2. In some embodiments, the fourth upper dummy pads 228 may be arranged to face the corners ED of the second die 200.

The fourth upper dummy pads 228 may each have a tetragonal shape when viewed in a plan view. For example, the fourth upper dummy pads 228 may each have a square or rectangular shape when viewed in a plan view. The fourth upper dummy pads 228 may have major axes that are provided in a direction that leads away from the signal region SR and are directed toward the corners ED of the second die 200. As the dummy region DR is disposed to surround the signal region SR, some (e.g., one or more) lateral surfaces of the fourth upper dummy pads 228 may be directed toward the signal region SR, and other lateral surfaces of the fourth upper dummy pads 228 may be directed toward the corners ED of the second die 200. In this case, for example, in the embodiment illustrated in FIG. 6, the major axis of the fourth upper dummy pad 228 may have an angle of about 45 degrees relative to the major axis of the third upper dummy pad 226. For example, when viewed in a plan view, the fourth upper dummy pads 228 may have planar shapes that are rotated at an angle of about 45 degrees from a major axis of the planar shapes of the third upper dummy pads 226.

The second lower dummy pads 234 may include third lower dummy pads 236 and fourth lower dummy pads 238.

The third lower dummy pads 236 may be provided in the first dummy regions DR1. The third lower dummy pads 236 may be arranged in a direction that leads away from the signal region SR. For example, the third lower dummy pads 236 may be arranged along a direction from the signal region SR toward the lateral surfaces SS of the second die 200. In this sense, the third lower dummy pads 236 may be arranged along the first direction D1 and the second direction D2.

The third lower dummy pads 236 may each have a tetragonal shape when viewed in a plan view. For example, the third lower dummy pads 236 may each have a square or rectangular shape when viewed in a plan view. The third lower dummy pads 236 may have major axes that are provided in a direction that leads away from the signal region SR and are directed toward the lateral surfaces SS of the second die 200. For example, as the dummy region DR is disposed to surround the signal region SR, some (e.g., one or more) lateral surfaces of the third lower dummy pads 236 may be directed toward the signal region SR, and other lateral surfaces of the third lower dummy pads 236 may be directed toward the lateral surfaces SS of the second die 200.

The fourth lower dummy pads 238 may be provided in the second dummy regions DR2. The fourth lower dummy pads 238 may be arranged identically to the third lower dummy pads 236. For example, the fourth lower dummy pads 238 may be arranged along the first direction D1 and the second direction D2. In some embodiments, the fourth lower dummy pads 238 may be arranged to face the corners ED of the second die 200.

The fourth lower dummy pads 238 may each have a tetragonal shape when viewed in a plan view. For example, the fourth lower dummy pads 238 may each have a square or rectangular shape when viewed in a plan view. The fourth lower dummy pads 238 may have major axes that are provided in a direction that leads away from the signal region SR and are directed toward the corners ED of the second die 200. As the dummy region DR is disposed to surround the signal region SR, some lateral surfaces of the fourth lower dummy pads 238 may be directed toward the signal region SR, and other lateral surfaces of the fourth lower dummy pads 238 may be directed toward the corners ED of the second die 200. In this case, for example, in the embodiment illustrated in FIG. 4, the major axis of the fourth lower dummy pad 238 may have an angle of about 45 degrees relative to the major axis of the third lower dummy pad 236. For example, when viewed in a plan view, the fourth lower dummy pads 238 may have planar shapes that are rotated at an angle of about 45 degrees away from a major axis of the planar shapes of the third lower dummy pads 236.

The second bumps 244 may connect the second upper dummy pads 224 and the second lower dummy pads 234 that face each other in the dummy region DR. The second bumps 244 may have planar shapes that conform to those of the second upper dummy pads 224 and those of the second lower dummy pads 234. For example, the second bumps 244 may each have a tetragonal shape when viewed in a plan view. In this case, in the first dummy region DR1, the second bumps 244 may have lateral surfaces that are directed toward the signal region SR and other lateral surfaces that are directed toward the lateral surfaces SS of the second die 200. In addition, in the second dummy region DR2, the second bumps 244 may have lateral surfaces that are directed toward the signal region SR and other lateral surfaces that are directed toward the corners ED of the second die 200.

Spaces between the second bumps 244 may provide a flow path along which the under-fill 300 migrates during fabrication of a semiconductor package. As the second bumps 244 are arranged toward the lateral surfaces SS of the second die 200 between the signal region SR and the lateral surfaces SS, the flow path may have a straight shape and the under-fill 300 may flow favorably. As the second bumps 244 are arranged toward the corners ED of the second die 200 between the signal region SR and the corners ED, the flow path may have a straight shape and the under-fill 300 may flow favorably. This will be further discussed below in detail in describing a method of fabricating a semiconductor package.

Figure 7:
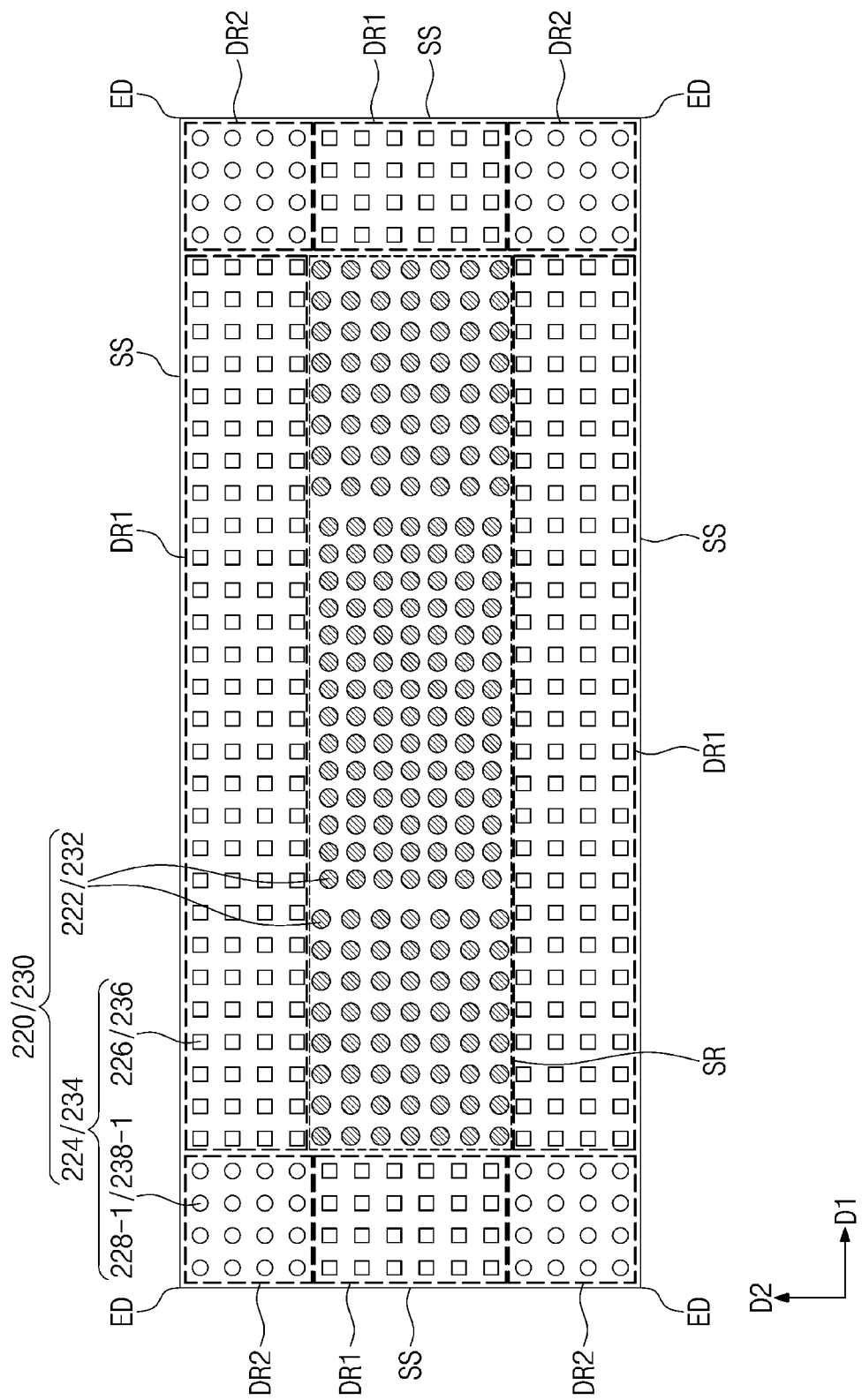

FIG. 7 is a plan view that shows a semiconductor package according to some embodiments of the present inventive concepts.

Referring to FIGS. 1 and 7, the third upper dummy pads 226 may each have a tetragonal shape when viewed in a plan view. For example, the third upper dummy pads 226 may each have a square or rectangular shape when viewed in a plan view. The third upper dummy pads 226 may have major axes that are provided in a direction that leads away from the signal region SR and are directed toward the lateral surfaces SS of the second die 200. For example, as the dummy region DR is disposed to surround the signal region SR, some lateral surfaces of the third upper dummy pads 226 may be directed toward the signal region SR, and other lateral surfaces of the third upper dummy pads 226 may be directed toward the lateral surfaces SS of the second die 200.

Fourth upper dummy pads 228-1 may each have a circular shape when viewed in a plan view.

The third lower dummy pads 236 may each have a tetragonal shape when viewed in a plan view. For example, the third lower dummy pads 236 may each have a square or rectangular shape when viewed in a plan view. The third lower dummy pads 236 may have major axes that are provided in a direction that leads away from the signal region SR and are directed toward the lateral surfaces SS of the second die 200. For example, as the dummy region DR is disposed to surround the signal region SR, some lateral surfaces of the third lower dummy pads 236 may be directed toward the signal region SR, and other lateral surfaces of the third lower dummy pads 236 may be directed toward the lateral surfaces SS of the second die 200.

Fourth lower dummy pads 238-1 may each have a circular shape when viewed in a plan view.

The second bumps 244 may connect the second upper dummy pads 224 and the second lower dummy pads 234 that face each other in the dummy region DR. The second bumps 244 may have planar shapes that conform to those of the second upper dummy pads 224 and those of the second lower dummy pads 234. For example, in the embodiment illustrated in FIG. 7 and when viewed in a plan view, the second bumps 244 may have tetragonal shapes in the first dummy region DR1 and circular shapes in the second dummy region DR2. As the fourth upper dummy pads 228-1, the fourth lower dummy pads 238-1, and the second bumps 244 have their circular shapes when viewed in a plan view between the signal region SR and the corners ED of the second die 200, the under-fill 300 may flow with relatively less obstruction from corners of the second bumps 244, and may flow more freely.

Figure 8:
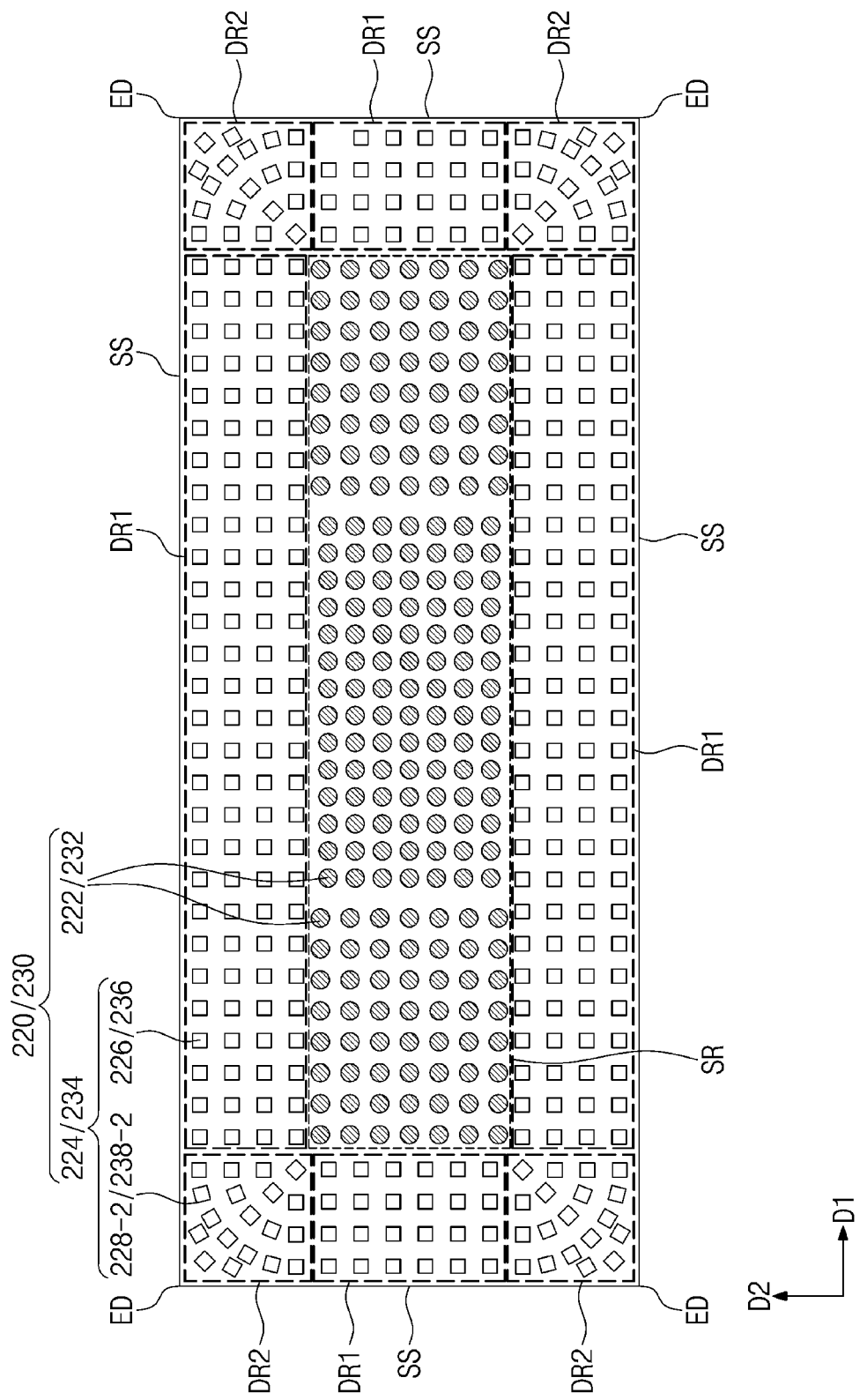

FIG. 8 is a plan view that shows a semiconductor package according to some embodiments of the present inventive concepts.

Referring to FIGS. 1 and 8, the second upper dummy pads 224 and the second lower dummy pads 234 may be arranged in a radial direction from the signal region SR.

The third upper dummy pads 226 may be arranged in a direction that leads away from the signal region SR in the first dummy regions DR1. For example, the third upper dummy pads 226 may be arranged along a direction from the signal region SR toward the lateral surfaces SS of the second die 200.

The upper dummy pads 228-2 may be arranged in a direction that leads away from the signal region SR in the second dummy regions DR2. For example, the fourth upper dummy pads 228-2 may be arranged along a direction that leads away from the signal region SR toward the corners ED of the second die 200. In this case, an arrangement direction of the fourth upper dummy pads 228-2 may be changed depending on position of the fourth upper dummy pads 228-2. For example, the fourth upper dummy pads 228-2 may be arranged in a radial direction from the signal region SR.

On the first dummy regions DR1, the third lower dummy pads 236 may be arranged in a direction that leads away from the signal region SR. For example, the third lower dummy pads 236 may be arranged along a direction from the signal region SR toward the lateral surfaces SS of the second die 200.

On the second dummy regions DR2, fourth lower dummy pads 238-2 may be arranged in a direction that leads away from the signal region SR. For example, the fourth upper dummy pads 228-2 may be arranged along a direction that leads away from the signal region SR toward the corners ED of the second die 200. In this case, an arrangement direction of the fourth lower dummy pads 238-2 may be changed depending on position of the fourth lower dummy pads 238-2. For example, the fourth lower dummy pads 238-2 may be arranged in a radial direction from the signal region SR.

The second bumps 244 may connect the second upper dummy pads 224 and the second lower dummy pads 234 that face each other in the dummy region DR. An arrangement of the second bumps 244 may conform to the arrangement of the second upper dummy pads 224 and that of the second lower dummy pads 234. For example, in the first dummy region DR1, the second bumps 244 may be arranged along a direction that originates from the signal region SR and leads toward the lateral surfaces SS of the second die 200, and in the second dummy region DR2, the second bumps 244 may be arranged along a direction that originates from the signal region SR and leads toward the corners ED of the second die 200. In semiconductor fabrication, the under-fill 300 may flow divergently in direction(s) that originate from the central portion of the second die 200, and the flow of the under-fill 300 may be favorable between the second bumps 244 arranged radially. This will be further discussed below in detail in describing a method of fabricating a semiconductor package.

Figure 9:
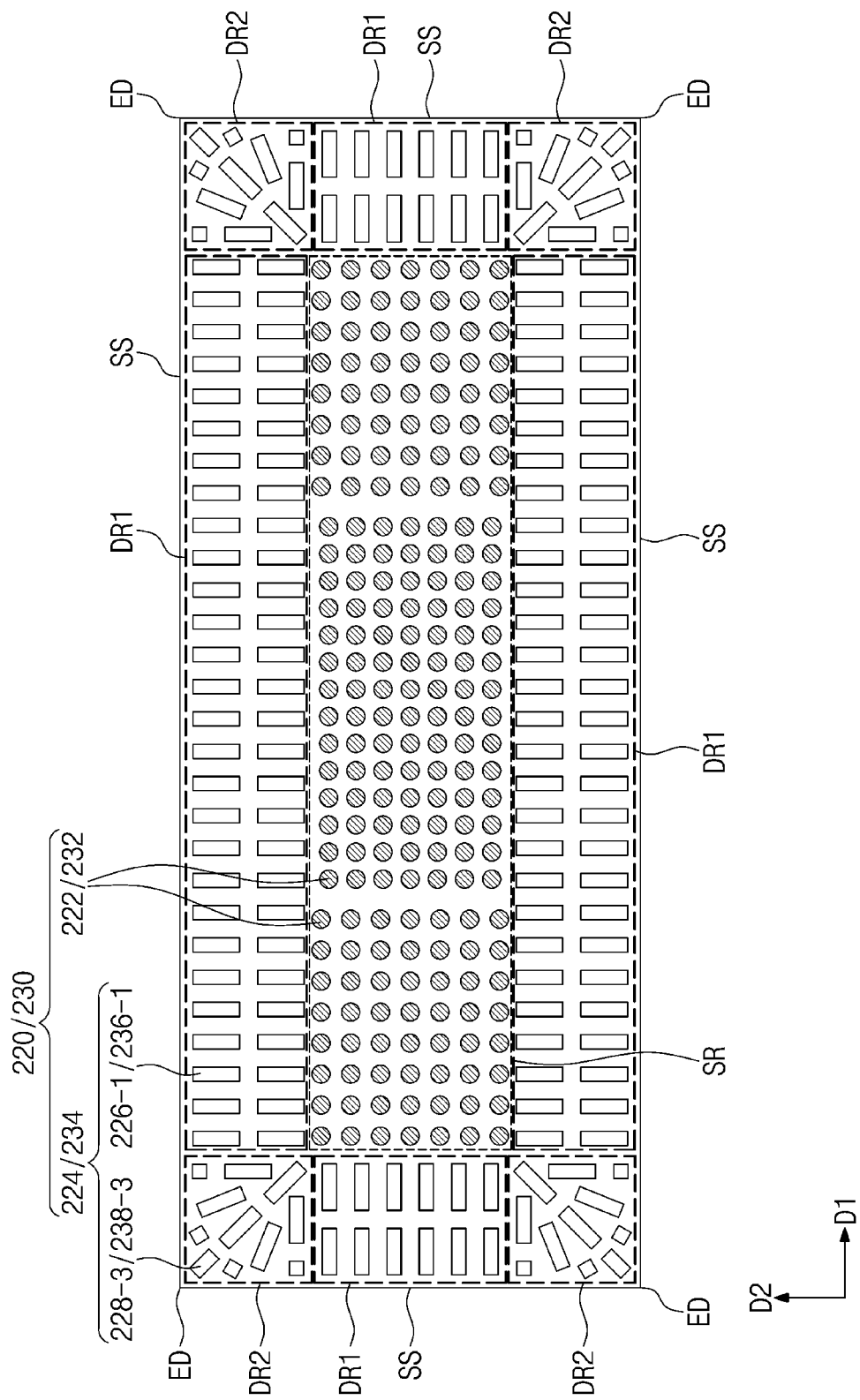

FIG. 9 is a plan view that shows a semiconductor package according to some example embodiments of the present inventive concepts.

Referring to FIGS. 1 and 9, the second upper dummy pads 224 and the second lower dummy pads 234 may each have a rectangular shape when viewed in a plan view.

Third upper dummy pads 226-1 may each have a rectangular shape when viewed in a plan view. The third upper dummy pads 226-1 may have major axes that extend from the signal region SR toward adjacent lateral surfaces SS of the second die 200. For example, the third upper dummy pads 226-1 may have short lateral surfaces that are directed toward the signal region SR and adjacent lateral surfaces SS of the second die 200. For example, each of the third upper dummy pads 226-1 may have a short lateral surface that is directed towards the signal region SR, and an opposite short lateral surface that is directed to an adjacent lateral surface SS.

Fourth upper dummy pads 228-3 may each have a rectangular shape when viewed in a plan view. The fourth upper dummy pads 228-3 may extend from the signal region SR toward adjacent corners ED of the second die 200. The fourth upper dummy pads 228-3 may have short lateral surfaces that are directed toward the signal region SR and adjacent corners ED of the second die 200.

Third lower dummy pads 236-1 may each have a rectangular shape when viewed in a plan view. The third lower dummy pads 236-1 may have major axes that extend from the signal region SR toward adjacent lateral surfaces SS of the second die 200. For example, the third lower dummy pads 236-1 may have short lateral surfaces that are directed toward the signal region SR and adjacent lateral surfaces SS of the second die 200.

Fourth lower dummy pads 238-3 may each have a rectangular shape when viewed in a plan view. The fourth lower dummy pads 238-3 may extend from the signal region SR toward adjacent corners ED of the second die 200. The fourth lower dummy pads 238-3 may have short lateral surfaces that are directed toward the signal region SR and adjacent corners ED of the second die 200.

The second bumps 244 may connect the second upper dummy pads 224 and the second lower dummy pads 234 that face each other in the dummy region DR. The second bumps 244 may have planar shapes that conform to those of the second upper dummy pads 224 and those of the second lower dummy pads 234. For example, the second bumps 244 may each have a rectangular shape when viewed in a plan view. The second bumps 244 may extend from the signal region SR toward adjacent lateral surfaces SS of the second die 200 between the signal region SR and the lateral surfaces SS of the second die 200. The second bumps 244 may extend from the signal region SR toward adjacent corners ED of the second die 200 between the signal region SR and the corners ED of the second die 200. Therefore, as the second upper dummy pads 224, the second lower dummy pads 234, and the second bumps 244 have rectangular shapes when viewed in a plan view, it may be possible to increase areas of the second upper dummy pads 224, the second lower dummy pads 234, and the second bumps 244 and to achieve increased heat transfer between the second dies 200. Accordingly, a semiconductor package according to the described embodiments may have increased thermal radiation efficiency. Moreover, the second upper dummy pads 224, the second lower dummy pads 234, and the second bumps 244 may have extending directions that lead away from the signal regions SR, and the extending directions may be the same as a flow direction of the under-fill 300. Thus, even when the second upper dummy pads 224, the second lower dummy pads 234, and the second bumps 244 have increased areas, the under-fill 300 may flow without obstruction.

Figure 10:
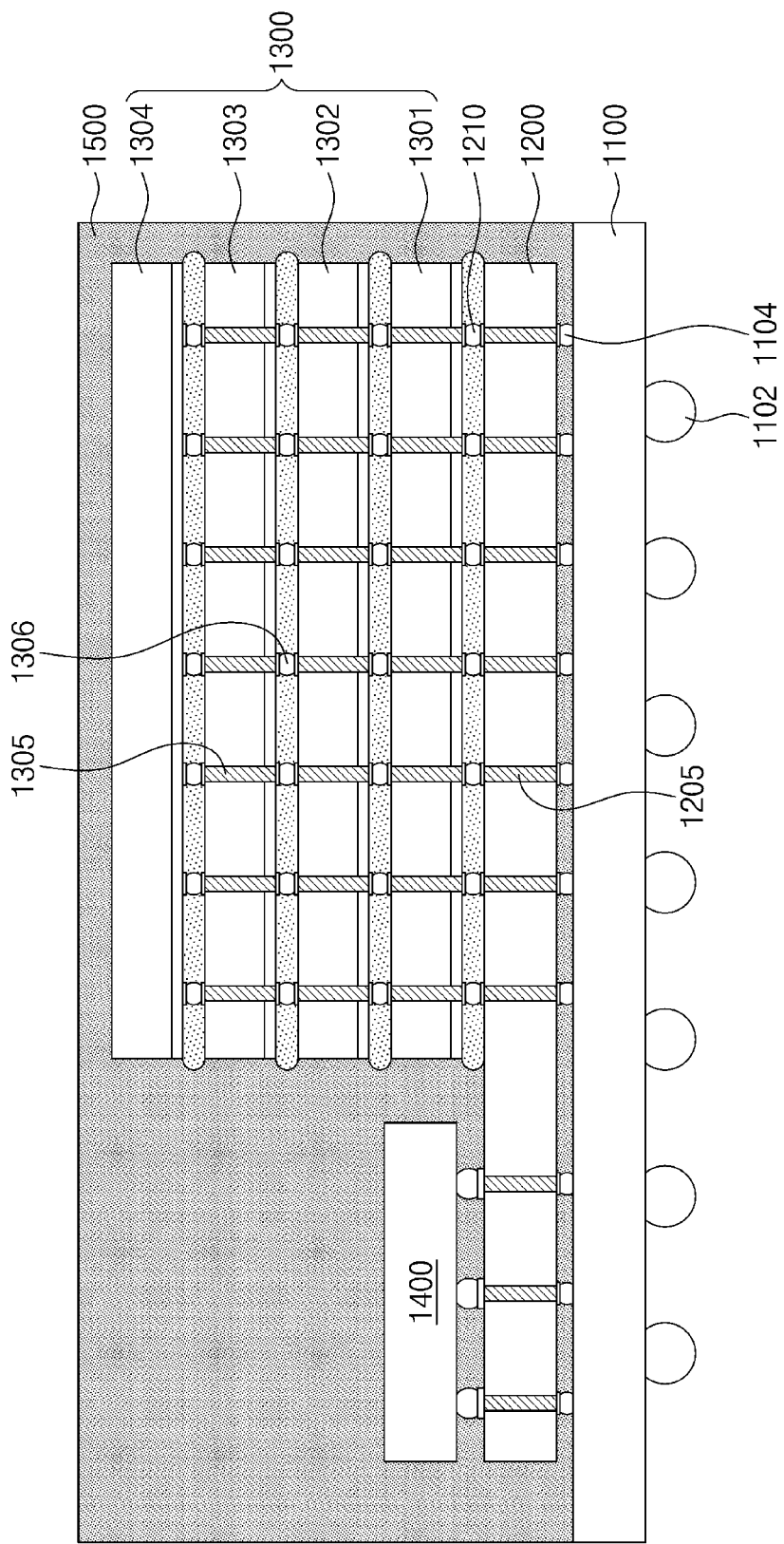
FIG. 10 is a cross-sectional view that shows a semiconductor module according to some embodiments of the present inventive concepts.

FIG. 10 is a cross-sectional view that shows a semiconductor module according to some embodiments of the present inventive concepts.

Referring to FIG. 10, a semiconductor module may be, for example, a memory module that includes a package substrate 1100 such as a printed circuit board having an external terminal 1102 attached thereto, a chip stack 1300 and a graphic processing unit (GPU) 1400 that are mounted on the package substrate 1100, and a molding layer 1500 that covers the chip stack 1300 and the graphic processing unit 1400. The semiconductor module may further include an interposer 1200 provided on the package substrate 1100.

The graphic processing unit 1400 and the chip stack 1300 may be electrically connected to the interposer 1200 through solder balls 1210 disposed on the interposer 1200. The interposer 1200 may include a through electrode 1205 and may be electrically connected to the package substrate 1100 through a solder ball 1104 disposed on the package substrate 1100.

The chip stack 1300 may include a plurality of high-bandwidth memory chips 1301, 1302, 1303, and 1304 which are stacked. The memory chips 1301, 1302, 1303, and 1304 may be electrically connected to each other through solder balls 1306. At least one of the memory chips 1301, 1302, 1303, and 1304 may include a through electrode 1305. For example, each of first, second, and third memory chips 1301, 1302, and 1303 may include at least one through electrode 1305. A fourth memory chip 1304 might not include a through electrode. In some embodiments, the fourth memory chip 1304 may include a through electrode 1305. The chip stack 1300 may have a structure identical or similar to that of the die stack DS depicted in FIGS. 1 to 9. In some embodiments, the interposer 1200 and the chip stack 1300 mounted on the interposer 1200 may each have a structure identical or similar to one of those of the semiconductor packages depicted in FIGS. 1 to 9. The description of the second die 200 of FIGS. 1 to 9, the pads 220 and 230 of the second die 200, and the bumps 240 of the second die 200 may be similarly applicable to the first, second, third, and fourth memory chips 1301, 1302, 1303, and 1304 and their pads and solder balls 1306.

Figure 13:
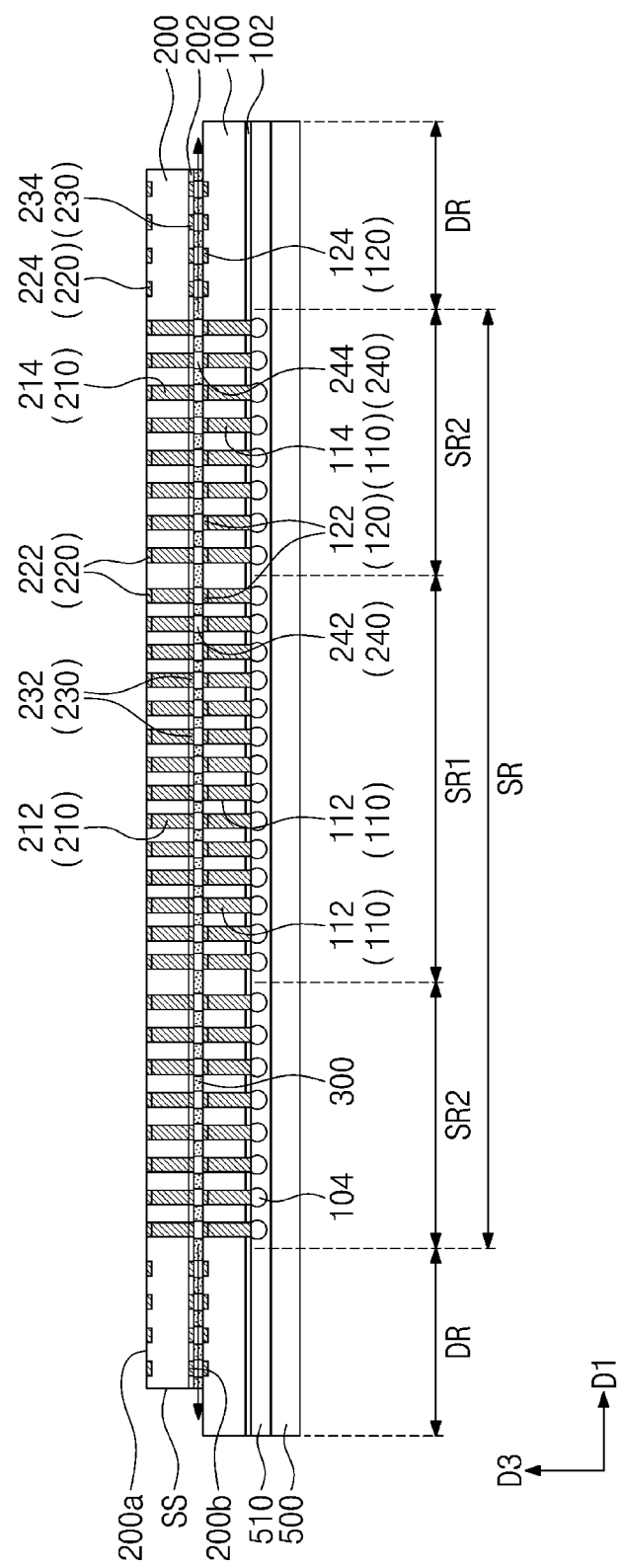
Figure 14:
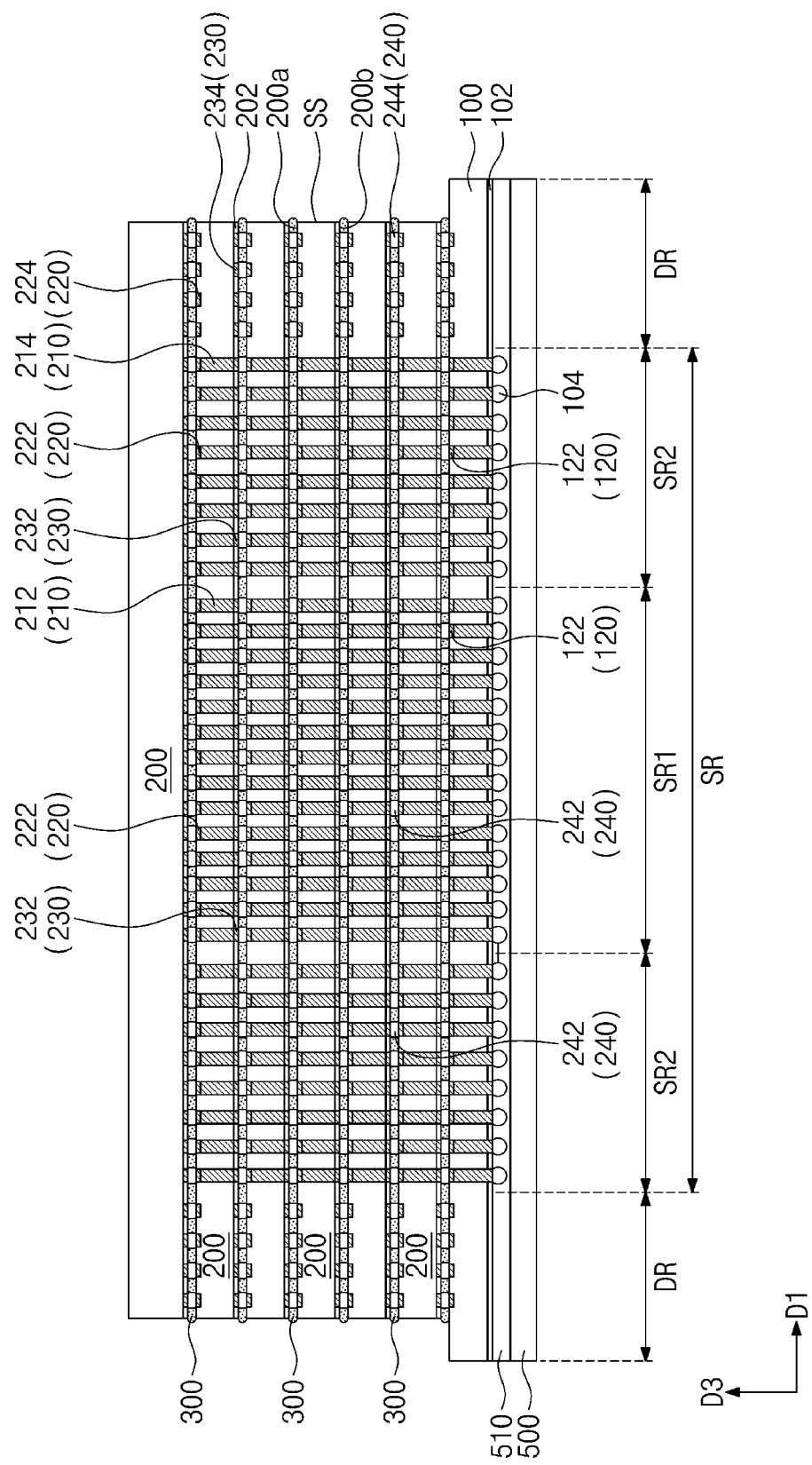
Figure 15:
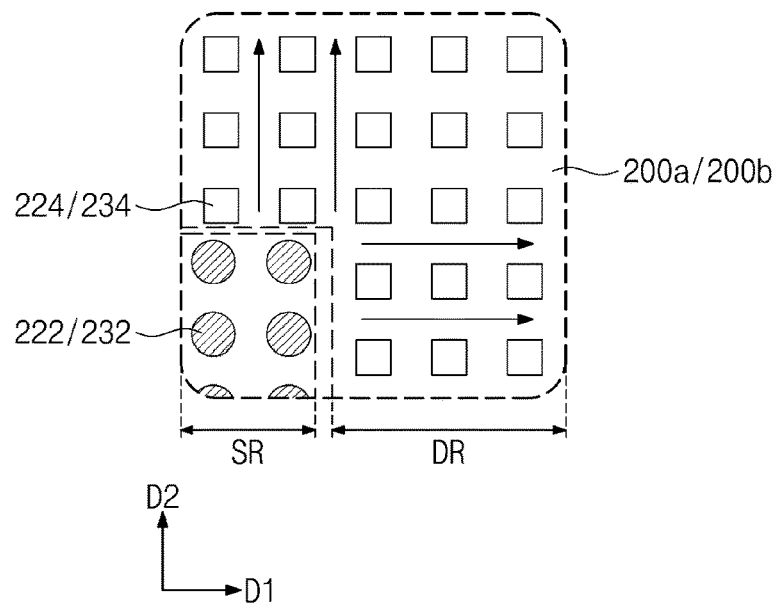
Figure 16:
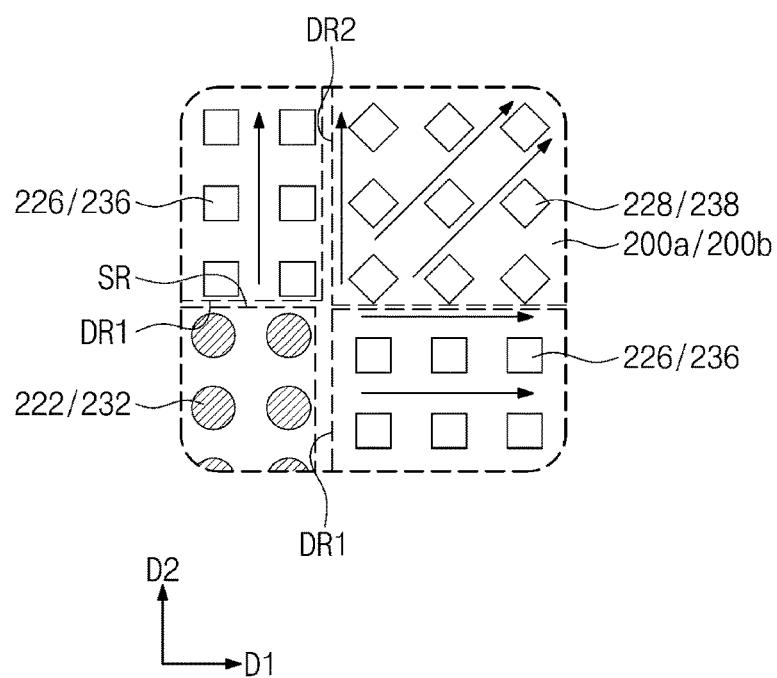
Figure 17:
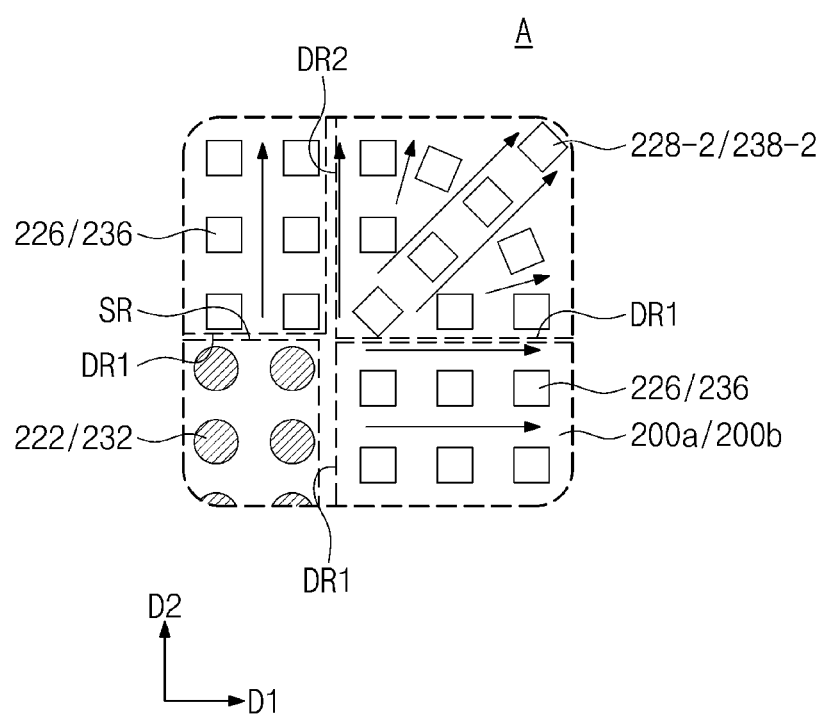

FIGS. 11 to 17 are cross-sectional and plan views that show a method of fabricating a semiconductor package according to some embodiments of the present inventive concepts. FIGS. 11 to 14 are cross-sectional views that show a method of fabricating a semiconductor package according to some embodiments of the present inventive concepts, and FIGS. 15 to 17 are enlarged plan views that partially show a top or bottom surface of a second die.

Figure 11:
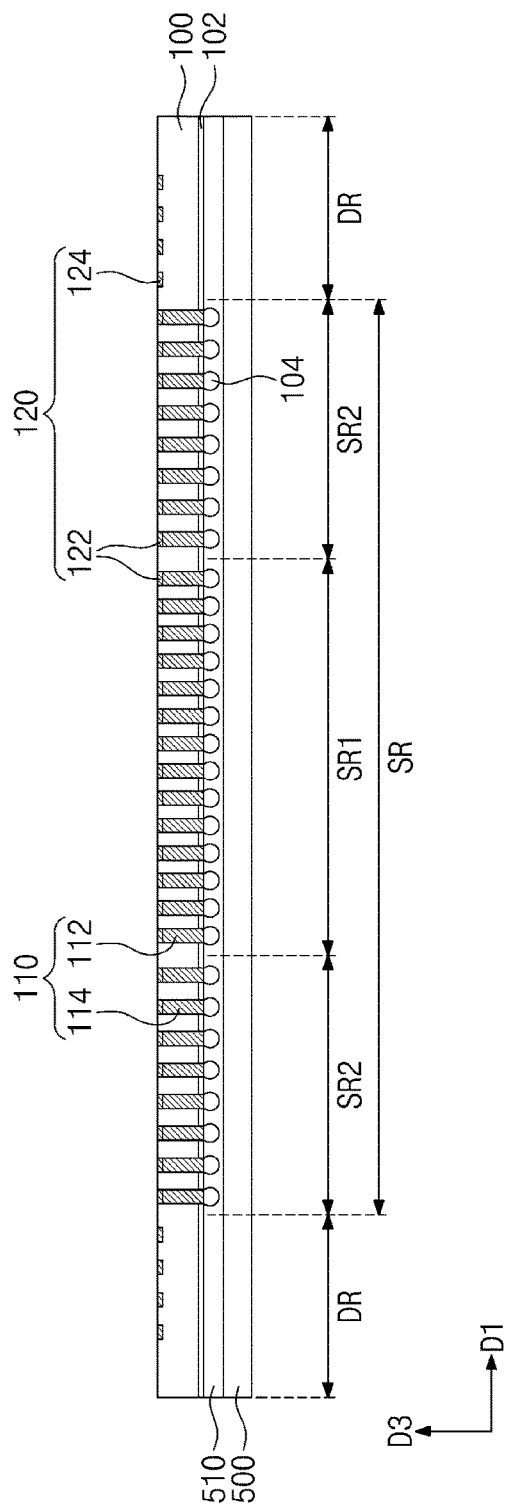
FIGS. 11 to 17 are cross-sectional and plan views that show a method of fabricating a semiconductor package according to some embodiments of the present inventive concepts.

Referring to FIGS. 1 and 11, a base substrate 100 may be formed on a carrier substrate 500. For example, a carrier glue layer 510 may be provided to attach the base substrate 100 to the carrier substrate 500.

The base substrate 100 may include an integrated circuit therein. For example, the base substrate 100 may be a first die which includes an electronic device such as a transistor. The base substrate 100 may be, for example, a wafer-level semiconductor die formed of a semiconductor such as silicon (Si). FIG. 11 shows that the base substrate 100 is a first die, but the present inventive concepts are not necessarily limited thereto. According to some embodiments of the present inventive concepts, the base substrate 100 might not include an electronic device such as a transistor. The following will discuss an example in which the base substrate 100 and the first die are the same component.

When viewed in a plan view, the first die 100 may include a signal region SR disposed on a central portion of the first die 100 and a dummy region DR that surrounds the signal region SR. The signal region SR may have a first signal region SR1 and a second signal region SR2 that are divided from each other. For example, the signal region SR may have two second signal regions SR2 with a first signal region SR1 disposed therebetween. The dummy region DR might not include a wiring line electrically connected to the integrated circuit of the first die 100.

The first die 100 may include a first circuit layer 102 and first vias 110.

The first circuit layer 102 may be provided on a bottom surface of the first die 100. The first circuit layer 102 may include the integrated circuit. For example, the bottom surface of the first die 100 may be an active surface of the first die 100.

The first vias 110 may penetrate through the first die 100 in the third direction D3. The first vias 110 may be electrically connected to the first circuit layer 102. The first vias 110 may include first signal vias 112 provided in the first signal region SR1 and first power/ground vias 114 provided in the second signal region SR2. The first die 100 might not include a separate via on the dummy region DR.

The first die 100 may include first upper pads 120 disposed on the top surface of the first die 100. The first upper pads 120 may include first upper signal pads 122 provided in the signal region SR and first upper dummy pads 124 provided in the dummy region DR.

The first upper signal pads 122 may be correspondingly coupled to the first vias 110. The first upper signal pads 122 may each have a circular shape when viewed in a plan view. An arrangement of the first upper signal pads 122 may conform to the arrangement of the first vias 110. For example, the first upper signal pads 122 may be arranged along the first direction D1 and the second direction D2.

The first upper dummy pads 124 may be provided in the dummy region DR and may be electrically insulated from the first vias 110 and the first circuit layer 102. The first upper dummy pads 124 may each have a tetragonal shape when viewed in a plan view. For example, some lateral surfaces of the first upper dummy pads 124 may be directed toward the signal region SR, and other lateral surfaces of the first upper dummy pads 124 may be directed toward lateral surfaces of the first die 100. The first upper dummy pads 124 may be arranged in a direction that leads away from the signal region SR. For example, the first upper dummy pads 124 may be arranged along a direction that leads from the signal region SR toward the lateral surfaces of the first die 100.

The first die 100 may include external terminals 104. The external terminals 104 may be provided on the bottom surface of the first die 100. The external terminals 104 may be disposed below the first vias 110. The external terminals 104 may be electrically connected to the first circuit layer 102 and the first vias 110.

Figure 12:
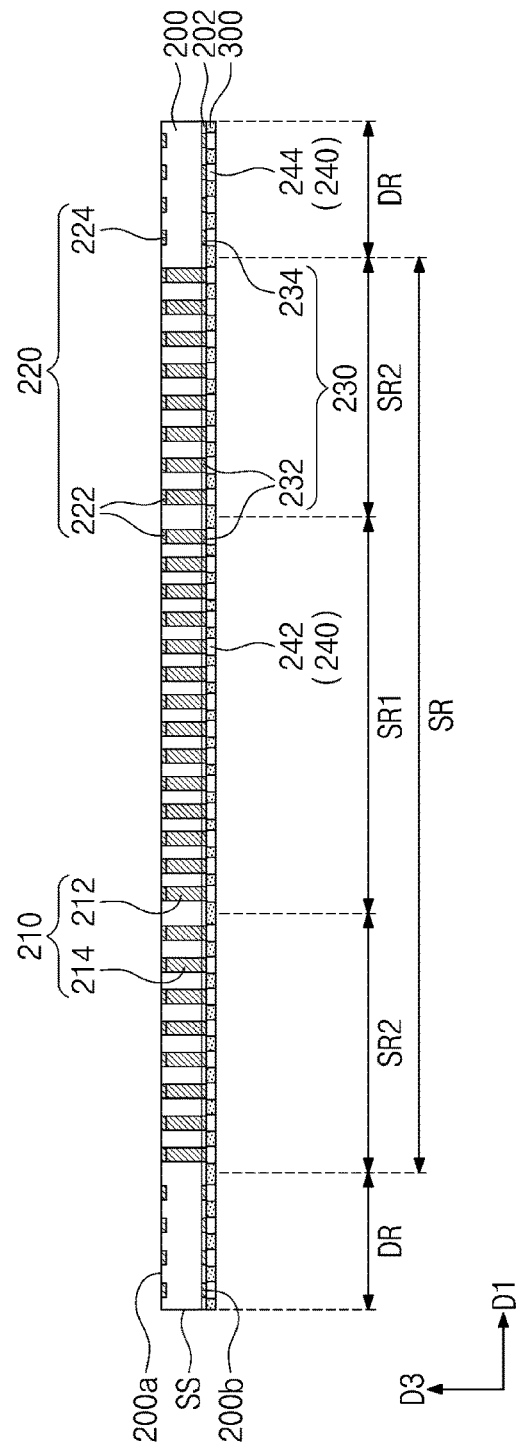

Referring to FIGS. 1 and 12, a second die 200 may be provided. The second die 200 may include an electronic device such as a transistor. For example, the second die 200 may be a wafer-level semiconductor die that includes a semiconductor material such as silicon (Si). The second die 200 may have a width less than that of the first die 100.

When viewed in a plan view, the second die 200 may include a signal region SR that rests on a central portion of the second die 200 and a dummy region DR that surrounds the signal region SR. The signal and dummy regions SR and DR of the second die 200 may correspond to the signal and dummy regions SR and DR of the first die 100.

The second die 200 may include a second circuit layer 202 and second vias 210.

The second circuit layer 202 may be provided on a bottom surface 200b of the second die 200. The second circuit layer 202 may include an integrated circuit. For example, the bottom surface 200b of the second die 200 may be an active surface of the second die 200.

The second vias 210 may penetrate in the third direction D3 through the second die 200. The second vias 210 may be electrically connected to the second circuit layer 202. The second vias 210 may include second signal vias 212 provided on the first signal region SR1 and second power/ground vias 214 provided on the second signal region SR2.

The second die 200 may include second upper pads 220 disposed on a top surface 200a of the second die 200. The second upper pads 220 may include second upper signal pads 222 provided in the signal region SR and second upper dummy pads 224 provided in the dummy region DR.

The second upper signal pads 222 may be correspondingly coupled to the second vias 210. The second upper signal pads 222 may each have a circular shape when viewed in a plan view. An arrangement of the second upper signal pads 222 may conform to the arrangement of the second vias 210. For example, the second upper signal pads 222 may be arranged along the first direction D1 and the second direction D2.

The second upper dummy pads 224 may be provided in the dummy region DR and may be electrically insulated from the second vias 210 and the second circuit layer 202. The second upper dummy pads 224 may each have a tetragonal shape when viewed in a plan view. For example, some lateral surfaces of the second upper dummy pads 224 may be directed toward the signal region SR, and other lateral surfaces of the second upper dummy pads 224 may be directed toward lateral surfaces SS of the second die 200. The second upper dummy pads 224 may be arranged in a direction that leads away from the signal region SR. For example, the second upper dummy pads 224 may be arranged along a direction that leads from the signal region SR toward the lateral surfaces SS of the second die 200.

The second die 200 may include second lower pads 230 disposed on the bottom surface 200b of the second die 200. The second lower pads 230 may include second lower signal pads 232 provided in the signal region SR and second lower dummy pads 234 provided in the dummy region DR.

The second lower signal pads 232 may be coupled to the second circuit layer 202 or the second vias 210. The second lower signal pads 232 may each have a circular shape when viewed in a plan view. The second lower signal pads 232 may be arranged along the first direction D1 and the second direction D2.

The second lower dummy pads 234 may be provided in the dummy region DR and may be electrically insulated from the second vias 210 and the second circuit layer 202. The second lower dummy pads 234 may each have a tetragonal shape when viewed in a plan view. For example, some lateral surfaces of the second lower dummy pads 234 may be directed toward the signal region SR, and other lateral surfaces of the second lower dummy pads 234 may be directed toward the lateral surfaces SS of the second die 200. The second lower dummy pads 234 may be arranged in a direction that leads away from the signal region SR. For example, the second lower dummy pads 234 may be arranged along a direction that leads from the signal region SR toward the lateral surfaces SS of the second die 200.

The second die 200 may include bumps 240. The bumps 240 may be provided on the bottom surface 200b of the second die 200. The bumps 240 may be disposed below the second lower pads 230. The bumps 240 may include microbumps.

The bumps 240 may include first bumps 242 disposed below the second lower signal pads 232 and second bumps 244 disposed below the second lower dummy pads 234. The first bumps 242 may be electrically connected to the second circuit layer 202 and the second vias 210. The second bumps 244 may be provided in the dummy region DR and may serve as dummy bumps. In this case, the second bumps 244 may be electrically insulated from the second vias 210. The second bumps 244 may serve to support an outer portion of the second die 200 on the first die 100, to attach the second die 200 to the first die 100, and to outwardly transfer heat generated from the first die 100 and the second die 200.

An under-fill 300 may be provided below the second die 200. For example, an under-fill material may be coated on the bottom surface 200b of the second die 200. The under-fill material may surround the bumps 240.

Referring to FIGS. 1 and 13, a second die 200 may be mounted on the first die 100. For example, the second die 200 and the first die 100 may constitute a chip-on-wafer (COW) structure. For example, the second die 200, which has a bottom surface 200b and the bumps 240 attached thereto, may face down to allow the bottom surface 200b to face the top surface of the first die 100. The second die 200 may be aligned with the first die 100 so as to place the bumps 240 between the first upper pads 120 and the second lower pads 230.

A reflow process may be performed on the bumps 240. Therefore, the bumps 240 may connect the first upper pads 120 to the second lower pads 230. For example, the first bumps 242 may connect the first upper signal pads 122 to the second lower signal pads 232, and the second bumps 244 may connect the first upper dummy pads 124 to the second lower dummy pads 234. Heat and pressure provided in the reflow process may cause the under-fill 300 to flow between the first die 100 and the second die 200. For example, as indicated by arrows shown in FIG. 13, the under-fill 300 may flow outwardly from a central portion of the second die 200. The under-fill 300 may fill spaces between the first die 100 and the second die 200.

Referring to FIG. 14, a plurality of second dies 200 may be stacked on the second die 200. An uppermost second die 200 might not include a second via 210. A process for mounting the second dies 200 may be substantially the same as the process for mounting the second die 200 on the first die 100.

Other second dies 200 may be mounted on one second die 200. For example, the bumps 240 may be attached to the bottom surface 200b of an overlying second die 200, and the overlying second die 200 may face down to allow its bottom surface 200b to face the top surface 200a of an underlying second die 200. The second dies 200 may be aligned with each other to place the bumps 240 between the second upper pads 220 and the second lower pads 230.

A reflow process may be performed on the bumps 240. Therefore, the bumps 240 may connect the second upper pads 220 to the second lower pads 230. For example, the first bumps 242 may connect the second upper signal pads 222 to the second lower signal pads 232, and the second bumps 244 may connect the second upper dummy pads 224 to the second lower dummy pads 234. In the reflow process, melted bumps 240 may be adhered to the second upper pads 220 and the second lower pads 230. In this case, surface tension may force the bumps 240 to have their planar shapes conform to those of corresponding second upper pads 220 and those of corresponding second lower pads 230. For example, when viewed in a plan view, the first bumps 242 may be formed to have their circular shapes, and the second bumps 244 may be formed to have their tetragonal shapes.

Heat and pressure provided in the reflow process may cause the under-fill 300 to flow between the first die 100 and the second die 200. For example, the under-fill 300 may flow outwardly from a central portion of the second die 200. For example, as indicated by arrows shown in FIG. 15, the under-fill 300 may flow from the signal region SR positioned on the central portion of the second die 200 toward the lateral surfaces SS of the second die 200. As the bumps 240 and the dummy pads 224 and 234 have their tetragonal shapes when viewed in a plan view, a flow path for the under-fill 300 may have a straight shape between the bumps 240 and the dummy pads 224 and 234, and the under-fill 300 may flow favorably.

In a comparative example, where the under-fill 300 is unable to flow favorably to the outside, a remaining amount of the under-fill 300 may become excessively large between the second dies 200, and the under-fill 300 may interrupt access to the second dies 200. According to some embodiments of the present inventive concepts, the under-fill 300 may flow favorably, and thus it may be possible to decrease the occurrence of process defects and to increase structural stability of semiconductor packages. The under-fill 300 may fill spaces between the first die 100 and the second die 200.

When the second die 200 is configured identically to the embodiment of FIG. 6, the second upper dummy pads 224 may include third upper dummy pads 226 in first dummy regions DR1 and fourth upper dummy pads 228 in second dummy regions DR2. The second lower dummy pads 234 may include third lower dummy pads 236 in the first dummy regions DR1 and fourth lower dummy pads 238 in the second dummy regions DR2. The fourth upper dummy pads 228 and the fourth lower dummy pads 238 may have lateral surfaces that are directed toward corners ED of the second die 200.

Heat and pressure provided in the reflow process may cause the under-fill 300 to flow between the first die 100 and the second die 200. For example, the under-fill 300 may flow outwardly from a central portion of the second die 200. For example, as indicated by arrows shown in FIG. 16, in the first dummy region DR1 adjacent to the lateral surface (see SS of FIG. 6) of the second die 200, the under-fill 300 may flow from the signal region SR toward the lateral surface SS of the second die 200, and in the second dummy region DR2 adjacent to the corner (see ED of FIG. 6) of the second die 200, the under-fill 300 may flow from the signal region SR toward the corner ED of the second die 200. In the second dummy region DR2, the dummy pads 224 and 234 and the bumps 240 may be aligned such that their lateral surfaces face the corner ED of the second die 200, and the under-fill 300 may flow favorably.

When the second die 200 is configured identically to the embodiment of FIG. 8, the second upper dummy pads 224 may include third upper dummy pads 226 in first dummy regions DR1 and fourth upper dummy pads 228 in second dummy regions DR2. The second lower dummy pads 234 may include third lower dummy pads 236 in the first dummy regions DR1 and fourth lower dummy pads 238 in the second dummy regions DR2. The fourth upper dummy pads 228 and the fourth lower dummy pads 238 may be arranged in radial direction(s) that lead from the signal region SR.

Heat and pressure provided in the reflow process may cause the under-fill 300 to flow between the first die 100 and the second die 200. For example, the under-fill 300 may flow outwardly from a central portion of the second die 200. For example, as indicated by arrows shown in FIG. 17, in the first dummy region DR1 adjacent to the lateral surface (see SS of FIG. 8) of the second die 200, the under-fill 300 may flow from the signal region SR toward the lateral surface SS of the second die 200, and in the second dummy region DR2 adjacent to the corner (see ED of FIG. 8) of the second die 200, the under-fill 300 may flow divergently in direction(s) from the signal region SR. In the second dummy region DR2, the dummy pads 224 and 234 and the bumps 240 may be arranged radially, and the under-fill 300 may flow more favorably.

Referring back to FIGS. 1 and 14, the plurality of second dies 200 may be electrically connected to each other through the bumps 240 provided on the bottom surfaces 200b thereof. The bumps 240 may connect the second upper pads 220 to the second lower pads 230 that are adjacent in the third direction D3 to the second upper pads 220.

Referring back to FIG. 1, a molding layer 400 may be formed on the top surface of the first die 100. The molding layer 400 may cover the top surface of the first die 100. When viewed in a plan view, the molding layer 400 may surround the second dies 200. The molding layer 400 may include a dielectric polymer material. For example, molding layer 400 may include an epoxy molding compound (EMC).

Thereafter, the carrier substrate 500 and the carrier glue layer 510 may be removed. For example, the carrier substrate 500 and the carrier glue layer 510 may be removed to expose the external terminals 104 and a passivation layer of the first die 100.

The processes mentioned above may be used to fabricate a semiconductor package according to the present inventive concepts.

A semiconductor package according to some embodiments of the present inventive concepts may increase thermal radiation efficiency of dies therein without causing an under-fill to have a reduced width between the dies. For example, the under-fill may not be obstructed during a flow process in a fabrication process of the semiconductor package.

In a method of fabricating a semiconductor package according to some embodiments of the present inventive concepts, an under-fill may have a straight flow path between dummy pads and bumps, and the under-fill may flow favorably, and accordingly process defects may be prevented.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
    a first die having a signal region and a dummy region that surrounds the signal region, wherein the signal region is disposed in a center of the first die, and wherein the first die includes a plurality of first vias disposed in the signal region;
    a second die stacked on the first die, wherein the second die includes a plurality of second vias disposed in the signal region, and wherein the second vias are positioned corresponding to the first vias;
    a plurality of first die pads disposed in the signal region and on a top surface of the first die, wherein the first die pads are coupled to the first vias, and wherein each of the first die pads has a circular planar shape;
    a plurality of first connection terminals disposed between the first die and the second die on the first die pads, wherein the first connection terminal couple the second vias to the first vias;
    a plurality of second die pads disposed in the dummy region on the top surface of the first die and including a plurality of corner die pads and a plurality of lateral die pads, wherein each of the second die pads has a rectangular planar shape; and
    a plurality of second connection terminals disposed between the first die and the second die on the second die pads, wherein the second connection terminals are electrically insulated from both the first vias and the second vias,
    wherein the corner die pads are radially arranged adjacent to a corner of the second die, and wherein each of the corner die pads has a major axis that is oriented towards a center of the second die.

2. The semiconductor package of claim 1, wherein a long side of the signal region extends in a first direction inside the dummy region.

3. The semiconductor package of claim 1, wherein, when viewed in a plan view, the dummy region includes a first dummy region adjacent to a corner of the first die and a second dummy region adjacent to a lateral surface of the first die, and
    wherein,
    in the first dummy region, the major axes of the corner die pads are directed toward the corner of the first die, and
    in the second dummy region, the major axes of the lateral die pads are directed toward the lateral surface of the first die.

4. The semiconductor package of claim 3, wherein planar shapes of one or more of the corner die pads in the first dummy region are rotationally shifted about 45 degrees with respect to the planar shapes of the lateral die pads in the second dummy region.

5. The semiconductor package of claim 3, wherein,
    in the first dummy region, the second die pads are arranged along a direction that leads toward the lateral surface of the first die, and
    in the second dummy region, the second die pads are arranged along a direction that leads toward the corner of the first die.

6. The semiconductor package of claim 1, further comprising a plurality of third die pads disposed in the dummy region and on a bottom surface of the second die,
    wherein the second connection terminals connect the second die pads to the third die pads, and
    wherein each of the third die pads has a planar shape that is the same as a planar shape of a corresponding second die pad.

7. The semiconductor package of claim 6, wherein each of the third die pads has a rectangular planar shape whose major axis is provided along a direction that leads away from the signal region.

8. The semiconductor package of claim 1, further comprising an under-fill that fills a space between the first die and the second die,
    wherein the under-fill surrounds the first die pads, the first connection terminals, the second die pads, and the second connection terminals.

9. A semiconductor package, comprising:
a substrate;
a plurality of dies vertically stacked on the substrate;
an under-fill that fills a space between the dies;
a molding layer disposed on the substrate and at least partially covering the dies; and
a plurality of external terminals on a bottom surface of the substrate,
wherein each of the dies includes:
a plurality of vias that vertically penetrate the dies;
a plurality of first pads disposed on a top surface of the dies and coupled to the vias; and
a plurality of second pads and a plurality of third pads both disposed on the top surface of the dies and electrically separated from the vias, wherein each of the second and third pads has a rectangular planar shape,
wherein the first pads are disposed in the center of each of the dies,
wherein the second pads are disposed adjacent to corners of the dies and arranged radially,
wherein each of the first pads has a circular planar shape,
wherein each of the second pads has a rectangular planar shape whose major axis is oriented towards a center of the substrate,
wherein a lateral surface of each of the second pads is directed toward the corners of the dies,
wherein the third pads are disposed adjacent to lateral surfaces of the dies, and
wherein a lateral surface of each of the third pads is directed toward the lateral surfaces of the dies.

10. The semiconductor package of claim 9, wherein
the first pads are disposed in central portions of the dies, and
the vias of the dies are connected to each other through first connection terminals disposed on the first pads.

11. The semiconductor package of claim 9, wherein the major axis of one or more of the second pads is rotated about 45 degrees relative to the major axis of the third pad.

12. The semiconductor package of claim 9, wherein,
the first pads are disposed in a signal region on a central portion of the die, and
wherein the second pads and the third pads are disposed in a dummy region that surrounds the signal region when viewed in a plan view.

13. The semiconductor package of claim 9, wherein
the second pads are arranged along a direction that leads toward the lateral surface of the die, and
wherein the third pads are arranged along a direction that leads toward the corner of the die.

14. The semiconductor package of claim 9, further comprising:
a plurality of first connection terminals disposed on the first pads;
a plurality of second connection terminals disposed on the second pads; and
a plurality of third connection terminals disposed on the third pads,
wherein the dies are electrically connected to each other through the first connection terminals, and
wherein, between the dies, the under-fill surrounds the first connection terminals, the second connection terminals, and the third connection terminals.

15. The semiconductor package of claim 14, wherein each of the second and third connection terminals has a rectangular planar shape,
wherein lateral surfaces of the second connection terminals are directed toward the corners of the dies, and
wherein lateral surfaces of the third connection terminals are directed toward the lateral surfaces of the dies.

16. A semiconductor package, comprising:
a first die including a plurality of first vias disposed in a first central portion of the first die, a plurality of first pads coupled to the first vias, and a plurality of second pads electrically separated from the first vias;
a second die stacked on the first die, the second die including a plurality of second vias disposed in a second central portion of the second die, a plurality of third pads coupled to the second vias, and a plurality of fourth pads electrically separated from the second vias, wherein the second vias are positioned to correspond to the first vias;
a plurality of first connection terminals that connect the first pads to the third pads; and
a plurality of second connection terminals that connect the second pads to the fourth pads,
wherein each of the first and third pads has a circular planar shape,
wherein each of the second and fourth pads has a rectangular planar shape,
wherein the second pads are arranged radially from the first central portion of the first die, and wherein each of the second pads has a rectangular planar shape whose major axis is oriented toward the first central portion of the first die, and
wherein the fourth pads are arranged radially from the second central portion of the second die, and wherein each of the fourth pads has a rectangular planar shape whose major axis is oriented toward the second central portion of the second die.

17. The semiconductor package of claim 16, wherein,
the second pads are disposed in a first outer portion that surrounds the first central portion of the first die,
wherein lateral surfaces of the second pads are directed toward the first central portion of the first die,
wherein the fourth pads are disposed in a second outer portion that surrounds the second central portion of the second die, and
wherein lateral surfaces of the fourth pads are directed toward the second central portion of the second die.

* * * * *